(12) United States Patent
Lee et al.

(10) Patent No.: US 12,733,176 B2
(45) Date of Patent: Sep. 8, 2026

(54) THREE-DIMENSIONAL FERROELECTRIC SEMICONDUCTOR MEMORY DEVICE

(71) Applicant: SAMSUNG ELECTRONICS CO., LTD., Suwon-si (KR)

(72) Inventors: Jeon Il Lee, Suwon-si (KR); Seryeun Yang, Suwon-si (KR); Hyeran Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 503 days.

(21) Appl. No.: 18/132,196

(22) Filed: Apr. 7, 2023

(65) Prior Publication Data

US 2024/0015981 A1 Jan. 11, 2024

(30) Foreign Application Priority Data

Jul. 6, 2022 (KR) ........................ 10-2022-0083397

(51) Int. Cl.
*H10B 51/30* (2023.01)
*H10B 51/20* (2023.01)
(Continued)

(52) U.S. Cl.
CPC ............. *H10B 51/30* (2023.02); *H10B 51/20* (2023.02); *H10B 51/40* (2023.02);
(Continued)

(58) Field of Classification Search
CPC ............... H10D 30/63; H10D 30/6728; H10D 30/6733; H10D 30/6757; H10D 62/292;
(Continued)

(56) References Cited

U.S. PATENT DOCUMENTS 6,788,573 B2 9/2004 Choi
9,236,396 B1 * 1/2016 Koka ..................... H10B 43/27
(Continued)

FOREIGN PATENT DOCUMENTS

CN 113871395 A * 12/2021 ........... H10D 30/701
KR 102856772 B1 * 9/2025 ......... H10D 30/6755
(Continued)

OTHER PUBLICATIONS

Sharma et al., "High Speed Memory Operation in Channel-Last, Back-gated Ferroelectric Transistors," 2020 IEEE International Electron Devices Meeting (IEDM), 2020, Total 4 pages.

*Primary Examiner* — Matthew E Warren
(74) *Attorney, Agent, or Firm* — Sughrue Mion, PLLC

(57) ABSTRACT

A semiconductor memory device is provided. The semiconductor memory device includes: a bit line that extends in a first direction; first and second word lines that extend in a second direction and cross the bit line; an active pattern on the bit line between the first and second word lines, the active pattern including first second vertical parts that are opposite to each other, and a horizontal part that extends between the first and second vertical parts; a first data storage pattern between the first word line and the first vertical part of the active pattern; a second data storage pattern between the second word line and the second vertical part of the active pattern; and a source line connected to the active pattern, the source line extending the first direction and crossing the first word line and the second word line.

19 Claims, 27 Drawing Sheets

(51) Int. Cl.

| | |
|---|---|
| ***H10B 51/40*** | (2023.01) |
| ***H10D 30/67*** | (2025.01) |
| ***H10D 62/17*** | (2025.01) |
| ***H10D 64/68*** | (2025.01) |

(52) U.S. Cl.
CPC ..... *H10D 30/6728* (2025.01); *H10D 30/6733* (2025.01); *H10D 30/6757* (2025.01); *H10D 62/292* (2025.01); *H10D 64/689* (2025.01)

(58) Field of Classification Search
CPC ...... H10D 64/689; H10B 51/10; H10B 51/20; H10B 51/30; H10B 51/40
See application file for complete search history.

(56) References Cited

U.S. PATENT DOCUMENTS

| | | | | |
|---|---|---|---|---|
| 9,685,215 | B1 | 6/2017 | Kang et al. | |
| 9,875,784 | B1 | 1/2018 | Li et al. | |
| 10,062,426 | B2 | 8/2018 | Karda et al. | |
| 10,283,184 | B2 | 5/2019 | Kim | |
| 10,629,732 | B1 * | 4/2020 | Sills | H10D 30/701 |
| 10,998,338 | B2 | 5/2021 | Karda et al. | |
| 11,139,396 | B2 | 10/2021 | Karda et al. | |
| 11,404,091 | B2 | 8/2022 | Lin et al. | |
| 2019/0348424 | A1 | 11/2019 | Karda et al. | |
| 2021/0066502 | A1 | 3/2021 | Karda et al. | |
| 2021/0175254 | A1 | 6/2021 | Van Houdt | |
| 2021/0367080 | A1 | 11/2021 | Lee et al. | |
| 2021/0375935 | A1 | 12/2021 | Ling et al. | |
| 2022/0130832 | A1 * | 4/2022 | Tsai | H10B 12/312 |
| 2023/0255017 | A1 * | 8/2023 | Kim | H10B 12/482 257/43 |
| 2023/0292492 | A1 * | 9/2023 | Kim | H10B 12/482 |
| 2023/0320101 | A1 * | 10/2023 | Hayakawa | H10B 51/30 257/295 |

FOREIGN PATENT DOCUMENTS

| | | |
|---|---|---|
| TW | I261253 B | 9/2006 |
| TW | I737565 B | 8/2021 |

* cited by examiner

THREE-DIMENSIONAL FERROELECTRIC SEMICONDUCTOR MEMORY DEVICE

CROSS-REFERENCE TO RELATED APPLICATION

This application claims priority to Korean Patent Application No. 10-2022-0083397, filed on Jul. 6, 2022, in the Korean Intellectual Property Office, the disclosure of which is incorporated by reference herein in its entirety.

BACKGROUND

The present disclosure relates to a semiconductor memory device, and more particularly, to a semiconductor memory device having improved electrical properties and increased integration.

Semiconductor devices are increasingly integrated to meet performance and efficiency requirements which are required by end users. Integration of typical two-dimensional or planar semiconductor devices is primarily determined by the area occupied by a unit memory cell, such that it is greatly influenced by the level of technology for forming fine patterns.

SUMMARY

Some example embodiments provide a semiconductor memory device having improved electrical properties and increased integration.

The present disclosure is not limited to the mentioned above, and other objects which have not been mentioned above will be clearly understood to those skilled in the art from the following description.

According to example embodiments, a semiconductor memory device, includes: a bit line that extends in a first direction; a first word line and a second word line that extend in a second direction and cross the bit line; an active pattern on the bit line between the first word line and the second word line, the active pattern including a first vertical part and a second vertical part that are opposite to each other, and a horizontal part that extends between the first vertical part and the second vertical part; a first data storage pattern between the first word line and the first vertical part of the active pattern; a second data storage pattern between the second word line and the second vertical part of the active pattern; and a source line connected to the active pattern, the source line extending the first direction and crossing the first word line and the second word line.

According to example embodiments, a semiconductor memory device, includes: bit lines that extend in a first direction and are spaced apart from each other in a second direction that crosses the first direction; first word lines and second word lines that extend in the second direction, cross the bit lines and are alternately arranged along the first direction; active patterns on each of the bit lines and each of regions between the first word lines and the second word lines, each of the active patterns including a first vertical part and a second vertical part that are opposite to each other and a horizontal part that extends between the first vertical part and the second vertical part; first ferroelectric patterns between the first word lines and the first vertical part of the active patterns; second ferroelectric patterns between the second word lines and the second vertical part of the active patterns; first source lines and second source lines that extend in the first direction and cross the first word lines and the second word lines; and shield lines disposed between the bit lines, respectively and extending in the first direction.

According to example embodiments, a semiconductor memory device, has a plurality of cell array layers that are vertically stacked on a lower dielectric layer, wherein each of the plurality of cell array layers includes: a bit line that extends in a first direction; a first word line and a second word line that extend in a second direction and cross the bit line; an active pattern on the bit line between the first word line and the second word line, the active pattern including a first vertical part and a second vertical part that are opposite to each other, and a horizontal part that extends between the first vertical part and the second vertical part; a first data storage pattern between the first word line and the first vertical part of the active pattern; a second data storage pattern between the second word line and the second vertical part of the active pattern; and a source line that extends in the first direction and crosses the first word line and the second word line.

BRIEF DESCRIPTION OF DRAWINGS

The above and other aspects and features will be more apparent from the following description of example embodiments, taken in conjunction with the accompanying drawings, in which:

FIG. 4 illustrates a plan view showing a semiconductor memory device according to some example embodiments.

FIGS. 16A, 17A, 18A, 19A, 20A and 21A illustrate plan views showing a method of fabricating a semiconductor memory device according to some example embodiments.

DETAILED DESCRIPTION

Example embodiments will be described more fully with reference to the accompanying drawings, in which example embodiments are shown. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
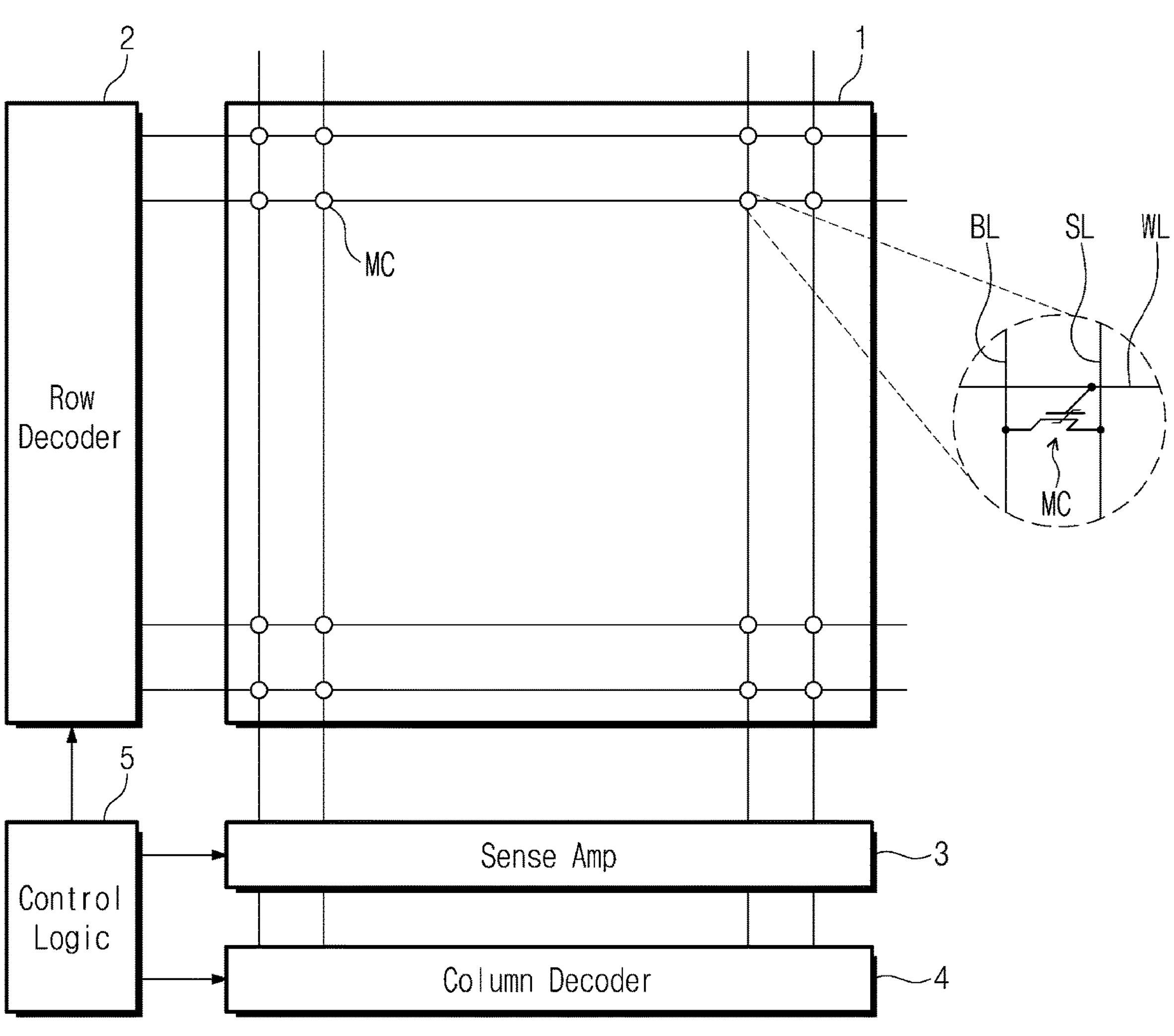
FIG. 1 illustrates a simplified circuit diagram showing a cell array of a semiconductor memory device according to some example embodiments.

FIG. 1 illustrates a simplified circuit diagram showing a cell array of a semiconductor memory device according to some example embodiments.

Referring to FIG. 1, a semiconductor memory device may include a memory cell array 1, a row decoder 2, a sense amplifier 3, a column decoder 4, and a control logic 5.

The memory cell array 1 may include a plurality of memory cells MC that are arranged three-dimensionally. Each of the memory cells MC may be formed of one transistor including a data storage layer or a memory layer. Each of the memory cells MC may be connected to one word line WL, one bit line BL, and one source line SL.

Each of the memory cells MC may include a ferroelectric field effect transistor (FeFET). Each of the memory cells MC may include a ferroelectric layer as a memory layer. The ferroelectric layer may have a spontaneous dipole (electric dipole), or spontaneous polarization, due to a non-centrosymmetric charge distribution in each memory cell. The ferroelectric layer may have dipole-induced remnant polarization even in the presence of no external electric field. In addition, a polarization direction may be switched in domain units by external electric field. For example, the ferroelectric layer may have a positive or negative polarization state, and the polarization state may be changed due to an electric field applied to the ferroelectric layer during a program operation. The ferroelectric layer may maintain its polarization state even if power is interrupted, and thus the semiconductor memory device may act as a nonvolatile memory device.

In each memory cell MC, a gate electrode may be provided through the word line WL with a first voltage, and a drain terminal may be provided through the bit line BL with a second voltage greater than the first voltage, with the result that a polarization of the ferroelectric layer may be set into a first polarization state. Therefore, the first polarization state (positive threshold voltage or write date voltage) may be stored in the ferroelectric layer. A difference between the first voltage and the second voltage may be equal to or greater than a minimum voltage difference required for setting the polarization of the ferroelectric layer into the first polarization state. In an operation where a data is written to the memory cell MC, a ground voltage or zero volt may be applied through the source line SL to a source terminal of the memory cell MC.

The gate electrode may be provided through the word line WL with a third voltage, and the drain terminal may be provided through the bit line BL with a fourth voltage less than the third voltage, with the result that the ferroelectric layer may be set into a second polarization state. Therefore, the second polarization state (negative threshold voltage) may be stored in the ferroelectric layer. A difference between the third voltage and the fourth voltage may be equal to or greater than a minimum voltage difference required for setting the polarization of the ferroelectric layer into the second polarization state.

The row decoder 2 may decode an address that is externally input and may select one of the word lines WL of the memory cell array 1. The address that is decoded in the row decoder 2 may be provided to a row driver, and in response to a control operation of control circuits, the row driver may provide a certain voltage to a selected word line WL and each of non-selected word lines WL.

In response to an address that is decoded from the column decoder 4, the sense amplifier 3 may detect and amplify a voltage difference between a selected bit line BL and a reference bit line, and may then output the amplified voltage difference.

The column decoder 4 may provide a data delivery path between the sense amplifier 3 and an external device (e.g., a memory controller). The column decoder 4 may decode an address that is externally input and may select one of the bit lines BL.

The control logic 5 may generate control signals that control operations to write data to the memory cell array 1 and/or to read data from the memory cell array 1.

Figure 2:
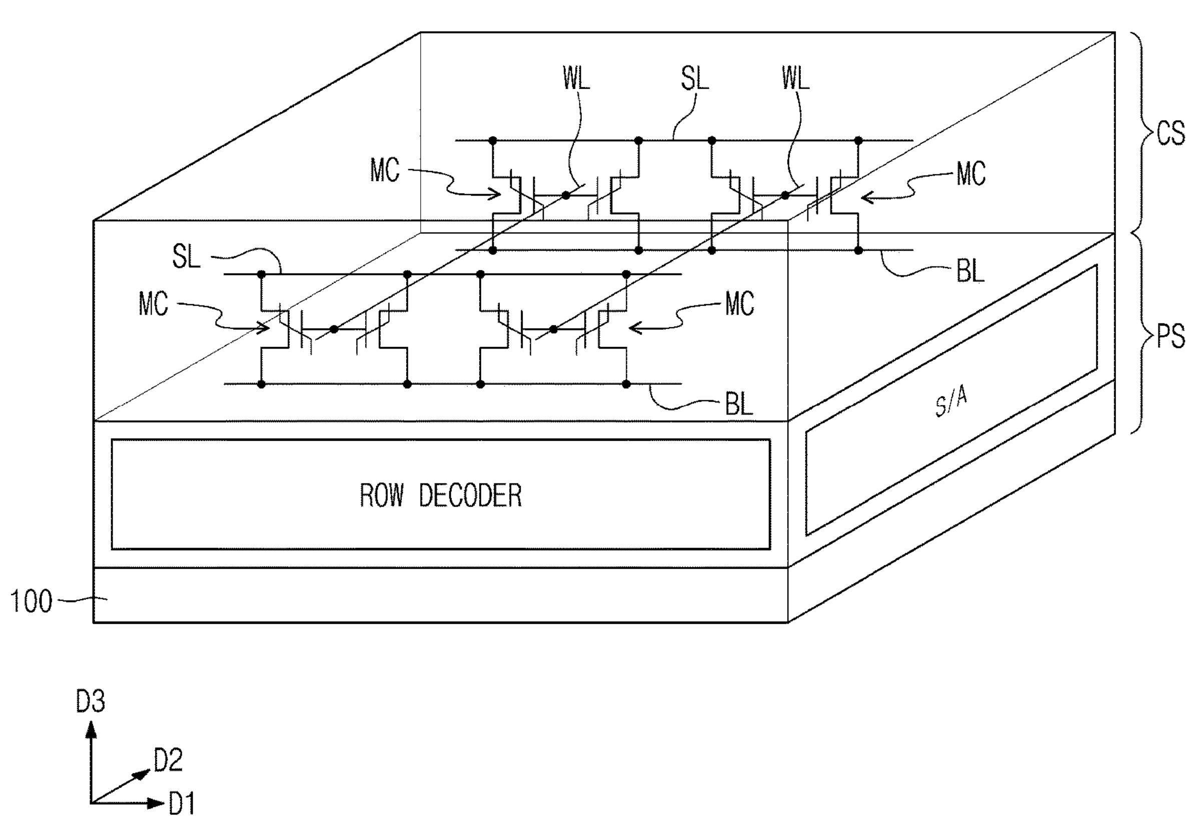
FIGS. 2 and 3 illustrate simplified perspective views showing a semiconductor memory device according to some example embodiments.
Figure 3:
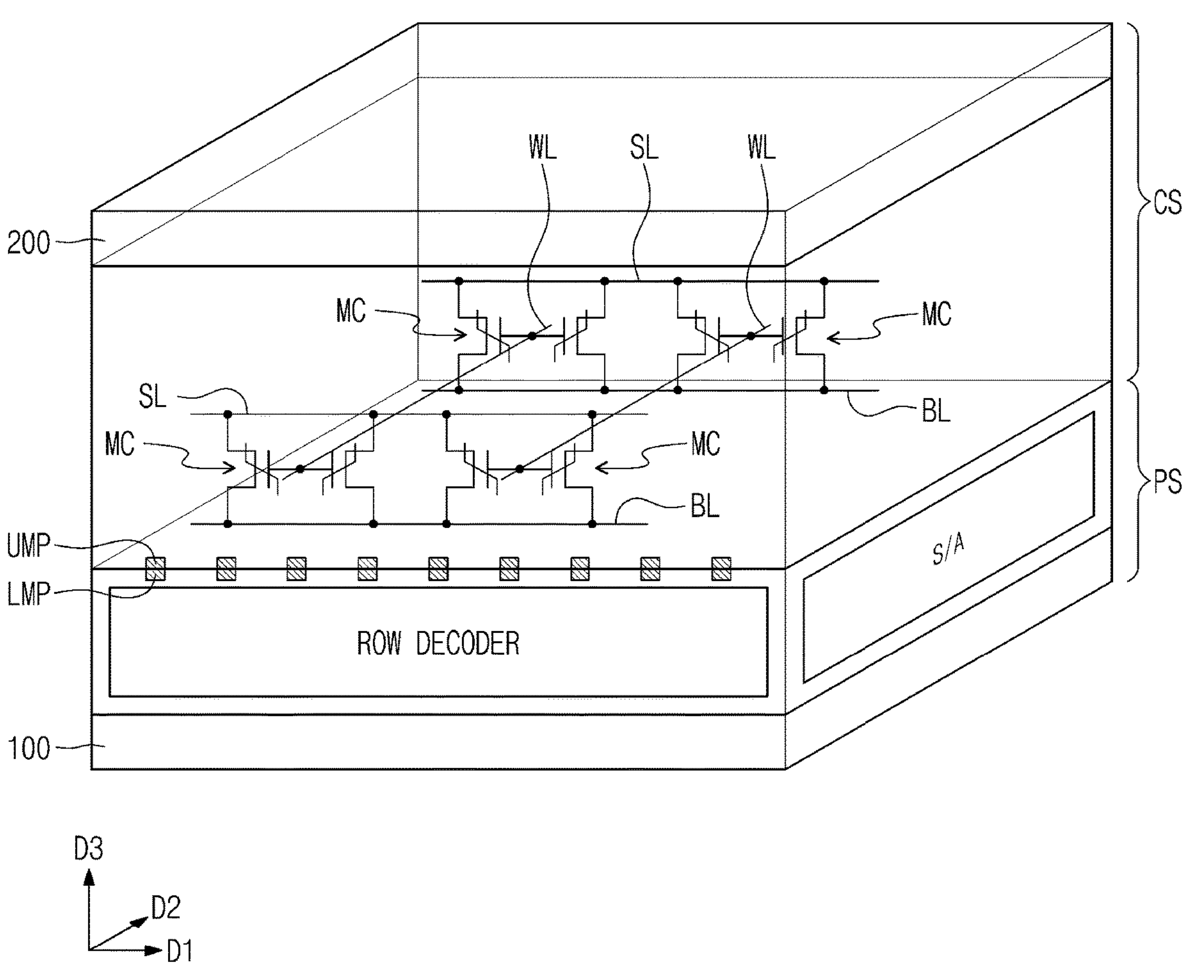
Figure 5A:
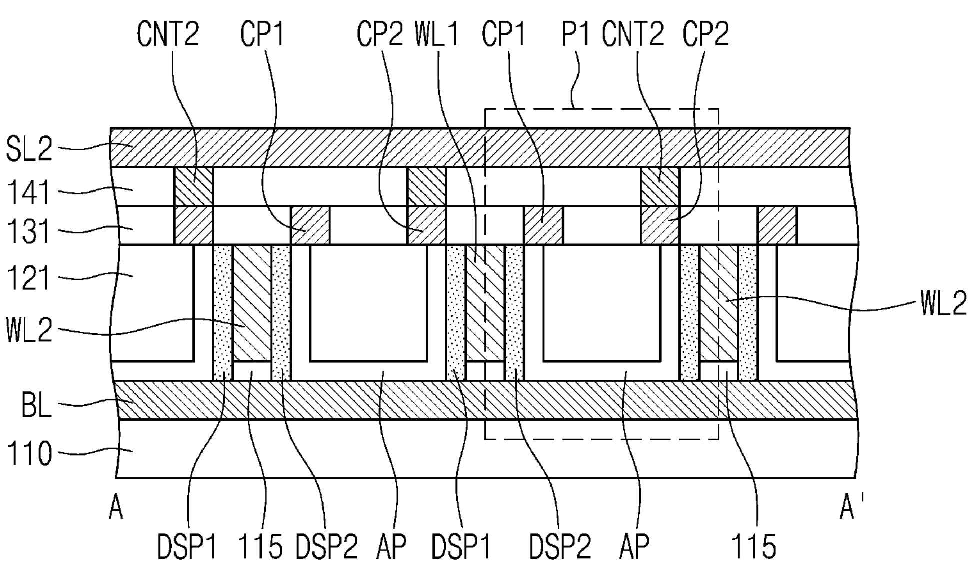
FIGS. 5A, 5B, 5C, and 5D illustrate cross-sectional views taken along lines A-A', B-B', C-C', and D-D' of FIG. 4, showing a semiconductor memory device according to some example embodiments.
Figure 5B:
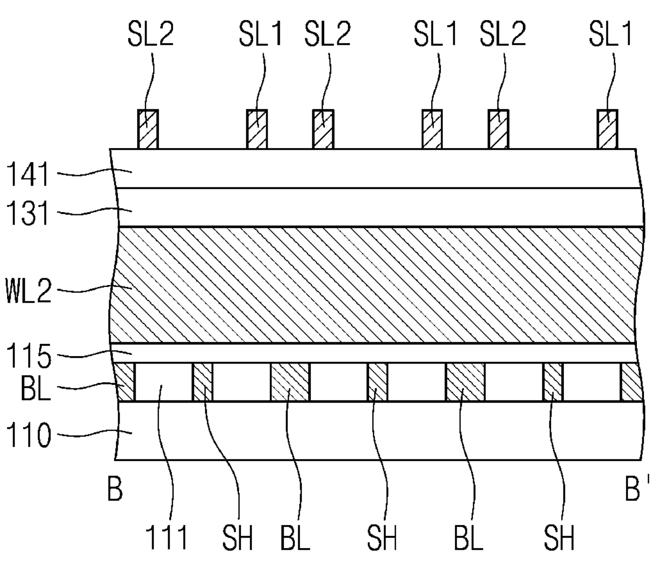
Figure 5C:
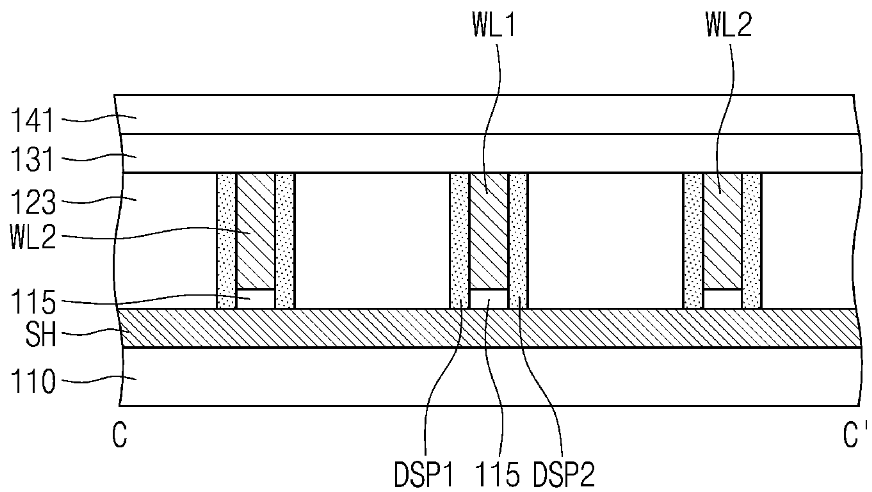
Figure 5D:
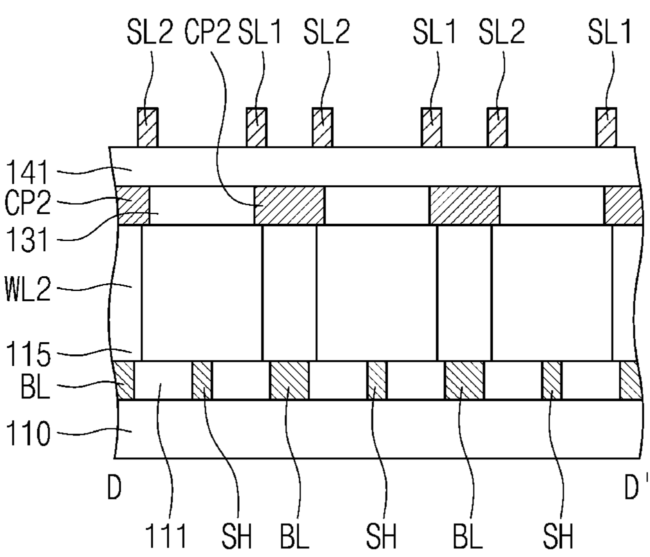

FIGS. 2 and 3 illustrate simplified perspective views showing a semiconductor memory device according to some example embodiments.

Referring to FIGS. 2 and 3, a semiconductor memory device may include a peripheral logic structure PS and a cell array structure CS stacked on the peripheral logic structure PS.

According to an example embodiment, as shown in FIG. 2, the peripheral circuit structure PS may be provided on a semiconductor substrate 100, and the cell array structure CS may be provided on the peripheral circuit structure PS.

The peripheral circuit structure PS may include core/peripheral circuits that are formed on the semiconductor substrate 100. The core/peripheral circuits may include row and column decoders (see 2 and 4 of FIG. 1), a sense amplifier (see 3 of FIG. 1), and control logics (see 5 of FIG. 1).

The cell array structure CS may include a memory cell array (see 1 of FIG. 1). The memory cell array (see 1 of FIG. 1) may include a plurality of memory cells MC, source lines SL, word lines WL, and bit lines BL.

The memory cells MC may be provided at intersections between the word lines WL, the bit lines BL, and the source lines SL. Each memory cell MC may be connected to one of the word lines WL, one of the bit lines BL, and one of the source lines SL.

As discussed above, each of the memory cells MC may be formed of one transistor including a data storage layer or a memory layer. Each of the memory cells MC may include a ferroelectric field effect transistor (FeFET).

Each of the memory cells MC may have a vertical channel that extends in a direction (e.g., a third direction D3) perpendicular to a top surface of the semiconductor substrate 100.

As shown in FIG. 3, the peripheral circuit structure PS may be provided on a first semiconductor substrate 100, and the cell array structure CS may be provided on a second semiconductor substrate 200.

The peripheral circuit structure PS may be provided on its uppermost layer with lower metal pads LMP. The lower metal pads LMP may be electrically connected to core/peripheral circuits (see 2, 3, 4, and 5 of FIG. 1).

The cell array structure CS may be provided on its uppermost layer with upper metal pads UMP. The upper metal pads UMP may be electrically connected to the memory cells MC. For example, the upper metal pads UMP may be electrically connected to the word lines WL, the bit lines BL, and the source lines SL. The upper metal pads UMP may be directly contacted with or bonded to the lower metal pads LMP of the peripheral circuit structure PS.

Figure 4:
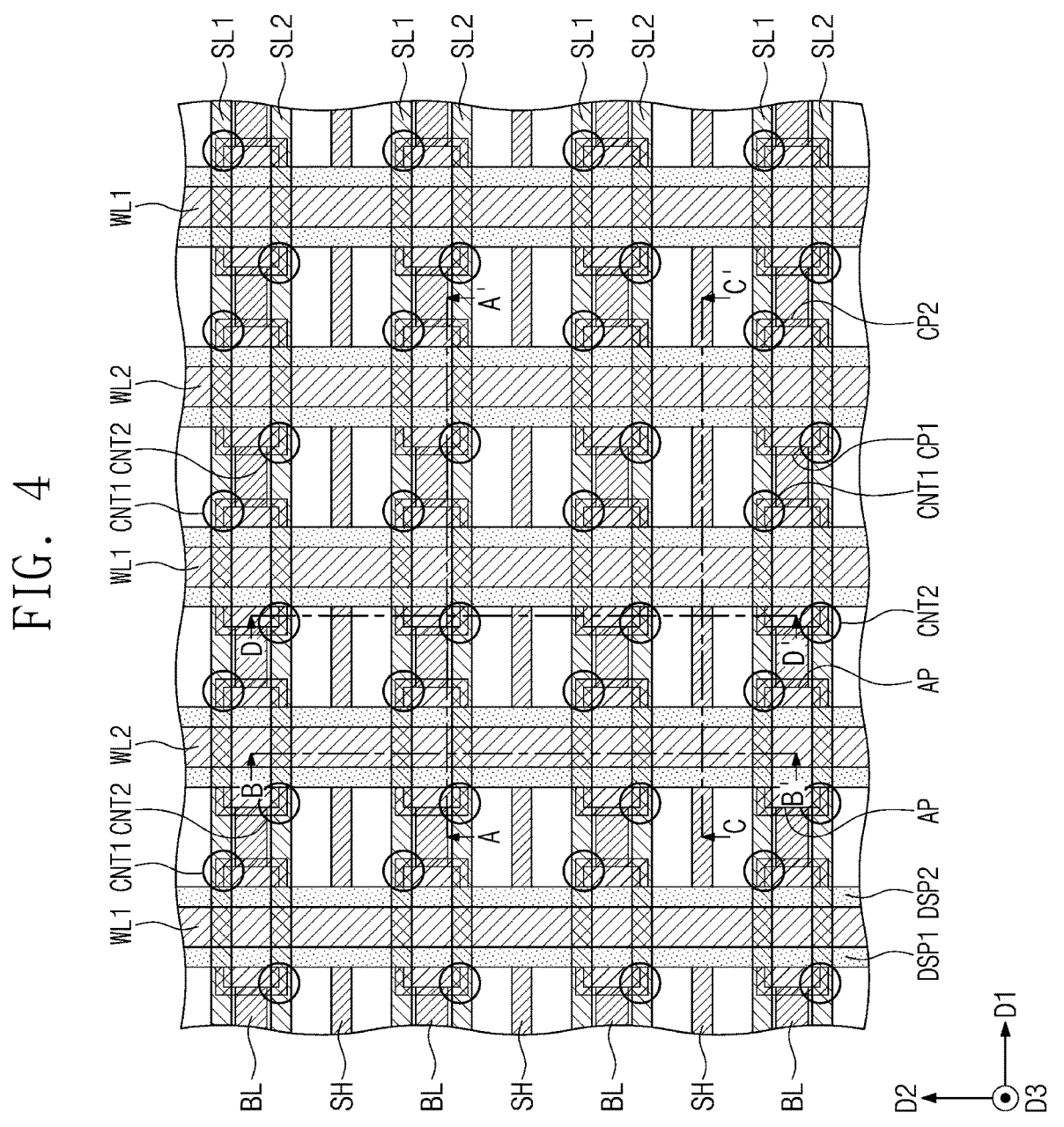
Figure 6:
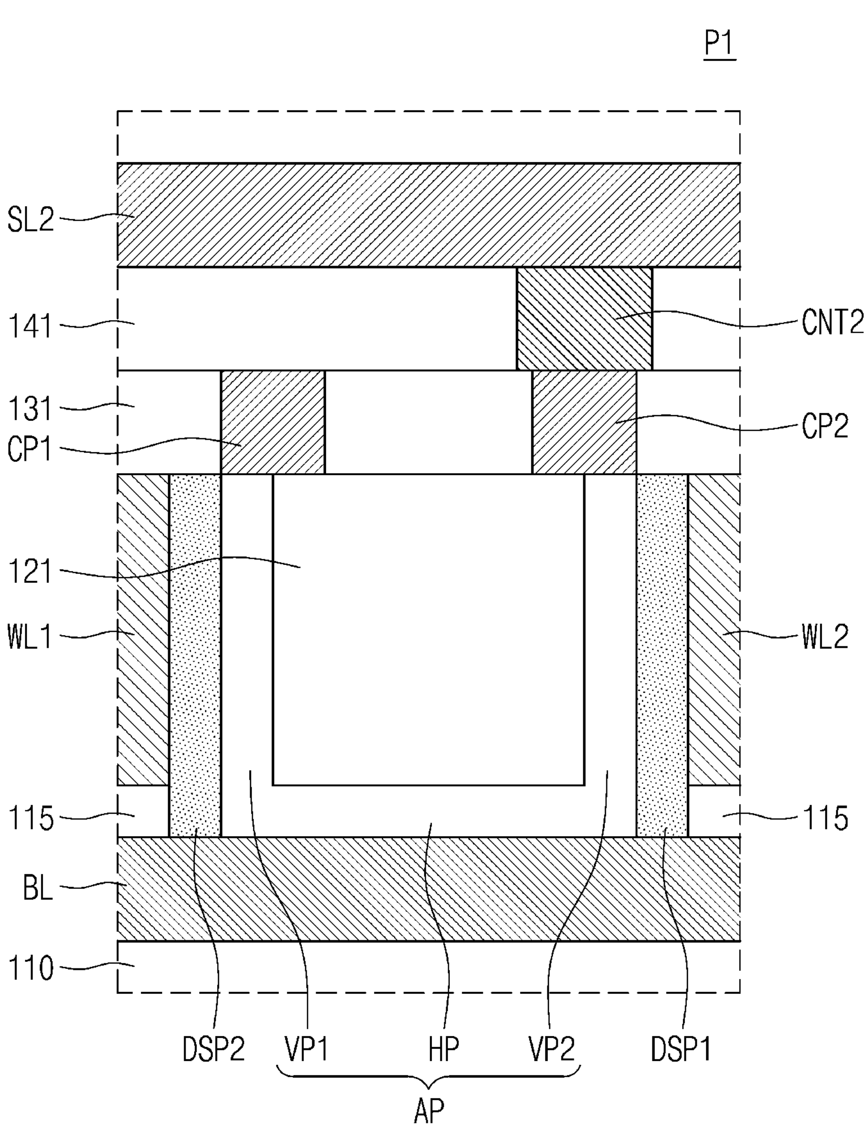
FIG. 6 illustrates an enlarged view showing section P1 of FIG. 5A.

FIG. 4 illustrates a plan view showing a semiconductor memory device according to some example embodiments. FIGS. 5A, 5B, 5C, and 5D illustrate cross-sectional views taken along lines A-A', B-B', C-C', and D-D' of FIG. 4, showing a semiconductor memory device according to some example embodiments. FIG. 6 illustrates an enlarged view showing section P1 of FIG. 5A.

Referring to FIGS. 4, 5A, 5B, 5C, and 5D, bit lines BL may extend in a first direction D1 on a lower dielectric layer 110 and may be disposed spaced apart from each other in a second direction D2. An interval between the bit lines BL may be greater than a width of each bit line BL.

The bit lines BL may include, for example, doped polysilicon, metal, conductive metal nitride, conductive metal silicide, conductive metal oxide, or any combination thereof. The bit lines BL may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but example embodiments are not limited thereto. The bit lines BL may include a single layer or multiple layers formed of one or more of the materials discussed above. In some example embodiments, the bit lines BL may include a two-dimensional or three-dimensional material, such as graphene as a carbon-based two-dimensional material, carbon nano-tube as a three-dimensional material, or any combination thereof.

A buried dielectric layer 111 may fill a space between the bit lines BL. The buried dielectric layer 111 may include, for example, one or more of a silicon oxide layer, a silicon nitride layer, a silicon oxynitride layer, and a low-k dielectric layer.

According to some example embodiments, shield lines SH may be correspondingly disposed between the bit lines BL on the lower dielectric layer 110. For example, the bit lines BL and the shield lines SH may be alternately disposed along the second direction D2. The shield lines SH may extend in the first direction D1 parallel to the bit lines BL. The shield lines SH may include the same conductive material as that of the bit lines BL. The shield lines SH may each have a width less than that of each bit line BL. According to some example embodiments, air gaps may be provided between the bit lines BL instead of the shield lines SH.

First and second word lines WL1 and WL2 may be disposed on the bit lines BL. The first and second word lines WL1 and WL2 may extend in the second direction D2 and cross the bit lines BL, and may be alternately disposed along the first direction D1. Each of the first and second word lines WL1 and WL2 may have a first sidewall and a second sidewall that are opposite to each other. An interval between the first and second word lines WL1 and WL2 may be greater than a width of each of the first and second word lines WL1 and WL2.

The first and second word lines WL1 and WL2 may include, for example, doped polysilicon, metal, conductive metal nitride, conductive metal silicide, conductive metal oxide, or any combination thereof. The first and second word lines WL1 and WL2 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but example embodiments are not limited thereto. The first and second word lines WL1 and WL2 may include a single layer or multiple layers including the materials discussed above. In some example embodiments, the first and second word lines WL1 and WL2 may include a two-dimensional or three-dimensional material, such as graphene as a carbon-based two-dimensional material, carbon nano-tube as a three-dimensional material, or any combination thereof.

Lower dielectric pattern 115 may be disposed between the bit lines BL and bottom surfaces of the first and second word lines WL1 and WL2. The lower dielectric patterns 115 may extend in the second direction D2 parallel to the first and second word lines WL1 and WL2. For example, the lower dielectric patterns 115 may be disposed on portions of the shield lines SH. The lower dielectric patterns 115 may be formed of a dielectric material, such as silicon oxide.

According to some example embodiments, active patterns AP may be disposed on the bit lines BL. The active patterns AP may be spaced apart from each other in the first direction D1 on each bit line BL. In addition, the active patterns AP may be disposed spaced apart from each other in the second direction D2 between the first and second word lines WL1 and WL2. For example, the active patterns AP may be two-dimensionally arranged along first and second directions D1 and D2 that intersect each other.

The active patterns AP may include an oxide semiconductor, which may include, for example, $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or any combination thereof. For example, the active patterns AP may include indium-gallium-zinc oxide (IGZO). The active patterns AP may include a single layer or multiple layers of the oxide semiconductor. The active patterns AP may include an amorphous, crystalline, or polycrystalline oxide semiconductor. In some example embodiments, the active patterns AP may have a bandgap energy greater than that of silicon. For example, the active patterns AP may have a bandgap energy of about 1.5 eV to about 5.6 eV. For example, the active patterns AP may have optimum channel performance when its bandgap energy ranges from about 2.0 eV to about 4.0 eV. The active patterns AP may be polycrystalline or amorphous, but example embodiments are not limited thereto. Alternatively, the active patterns AP may include a semiconductor material, such as silicon (Si), germanium (Ge), or silicon-germanium (SiGe). In some example embodiments, the active patterns AP may include a two-dimensional semiconductor material, such as graphene, carbon nano-tube, or any combination thereof.

Referring to FIG. 6, each of the active patterns AP may include a horizontal part HP disposed on the bit line BL and first and second vertical parts VP1 and VP2 that protrude in a third direction D3 from the horizontal direction D3. The first and second vertical parts VP1 and VP2 may be opposite to each other in the first direction D1.

Each of the first and second vertical parts VP1 and VP2 may have an inner sidewall and an outer sidewall, and the inner sidewalls of the first and second vertical parts VP1 and VP2 may face each other in the first direction D1. The outer sidewalls of the first and second vertical parts VP1 and VP2 may be adjacent to sidewalls of the first and second word lines WL1 and WL2.

A thickness in the first direction D1 of each of the first and second vertical parts VP1 and VP2 may be substantially the same as a thickness in the third direction D3 of the horizontal part HP. The thickness in the first direction D1 of each of the first and second vertical parts VP1 and VP2 may range from several to tens of nm. For example, the thickness in the first direction D1 of each of the first and second vertical parts VP1 and VP2 may range from about 1 nm to about 30 nm, for example, from about 1 nm to about 10 nm.

The first and second vertical parts VP1 and VP2 may each have a vertical length in the third direction D3, and the vertical length may be about two to ten times a thickness of each of the first and second vertical parts VP1 and VP2. The first and second vertical parts VP1 and VP2 may have top surfaces that are located at substantially the same level as that of top surfaces of the first and second word lines WL1 and WL2.

The horizontal part HP may be in direct contact with a top surface of the bit line BL. A width in the second direction D2 of the horizontal part HP may be substantially the same as or greater than that of the bit line BL.

The horizontal part HP may include a common source/drain region, the first vertical part VP1 may include a first source/drain region at a top end thereof, and the second vertical part VP2 may include a second source/drain region at a top end thereof.

The first vertical part VP1 may include a first channel region between the first source/drain region and the common source/drain region, and the second vertical part VP2 may include a second channel region between the second source/drain region and the common source/drain region.

The first channel region of the first vertical part VP1 may be controlled by the first word line WL1, and the second channel region of the second vertical part VP2 may be controlled by the second word line WL2. For example, neighboring active patterns AP may share the first word line WL1 or the second word line WL2. The first and second channel regions in the first and second vertical parts VP1 and VP2 may be perpendicular to a top surface of the lower dielectric layer 110 and parallel to the first and second sidewalls of the first and second word lines WL1 and WL2.

According to some example embodiments, first and second data storage patterns DSP1 and DSP2 may be disposed between the first and second word lines WL1 and WL1 and the first and second vertical parts VP1 and VP2 of the active patterns AP. The first and second data storage patterns DSP1 and DSP2 may be disposed on opposite sidewalls of each of the first and second word lines WL1 and WL2. For example, the first data storage pattern DSP1 may be disposed on the first sidewall of each of the first and second word lines WL1 and WL2, and the second data storage pattern DSP2 may be disposed on the second sidewall of each of the second word lines WL1 and WL2.

The first and second data storage patterns DSP1 and DSP2 may extend in the second direction D2 parallel to the first and second word lines WL1 and WL2. Each of the first and second data storage patterns DSP1 and DSP2 may have a uniform width in the first direction D1. The first and second data storage patterns DSP1 and DSP2 may have portions that are in contact with the top surfaces of the bit lines BL. The first and second data storage patterns DSP1 and DSP2 may have top surfaces that are located at substantially the same level as that of the top surfaces of the first and second word lines WL1 and WL2.

The first and second data storage patterns DSP1 and DSDP2 may include a ferroelectric material having polarization properties by an electric field applied thereto. The ferroelectric material may be formed of a dielectric material including hafnium. The ferroelectric material may include, for example, $HfO_2$, $HfSiO_2$ (Si-doped $HfO_2$), $HfAlO_2$ (Al-doped $HfO_2$), HfSiON, HfZnO, $HfZrO_2$, $ZrO_2$, $ZrSiO_2$, $HfZrSiO_2$, ZrSiON, LaAlO, $HfDyO_2$, or $HfScO_2$.

According to some example embodiments, dielectric layers may be interposed between the first and second data storage patterns DSP1 and DSP2 and the first and second vertical parts VP1 and VP2 of the active patterns AP.

A first buried dielectric pattern 121 may cover a top surface of the horizontal part HP of each active pattern AP and a side surface of the first and second vertical parts VP1 and VP2. The first buried dielectric pattern 121 may have a top surface located at substantially the same level as that of the top surfaces of the first and second vertical parts VP1 and VP2 of the active patterns AP. The first buried dielectric pattern 121 may be formed of, for example, one or more of a silicon oxide layer, a silicon nitride layer, a silicon oxynitride layer, and a low-k dielectric layer.

A second buried dielectric pattern 123 may be disposed between the active patterns AP that are adjacent to each other in the second direction D2. The second buried dielectric pattern 123 may cover top surfaces of the shield lines SH. The second buried dielectric pattern 123 may have a top surface substantially coplanar with that of the first buried dielectric pattern 121 and those of the first and second vertical parts VP1 and VP2 of each active pattern AP. The second buried dielectric pattern 123 may be formed of, for example, one or more of a silicon oxide layer, a silicon nitride layer, a silicon oxynitride layer, and a low-k dielectric layer.

A first interlayer dielectric layer 131 may be disposed on the first and second buried dielectric patterns 121 and 123. The first interlayer dielectric layer 131 may cover the top surfaces of the first and second word lines WL1 and WL2, the top surfaces of the first and second data storage patterns DSP1 and DSP2, and the top surfaces of the first and second vertical parts VP1 and VP2 of the active patterns AP. The first interlayer dielectric layer 131 may be formed of, for example, one or more of a silicon oxide layer, a silicon nitride layer, a silicon oxynitride layer, and a low-k dielectric layer.

First and second conductive pads CP1 and CP2, in respective contact with the first and second vertical parts VP1 and VP2 of the active patterns AP, may be provided in the first interlayer dielectric layer 131. The first and second conductive pads CP1 and CP2 may be spaced apart from each other in the first direction D1 and the second direction D2. The first and second conductive pads CP1 and CP2 may be electrically separated from the first and second word lines WL1 and WL2.

Areas of the first and second conductive pads CP1 and CP2 may be greater than those of the first and second vertical parts VP1 and VP2. For example, a length in the second direction D2 of each of the first and second conductive pads CP1 and CP2 may be greater than a length in the second direction D2 of each of the first and second vertical parts VP1 and VP2 of each active pattern AP. A width in the first direction D1 of each of the first and second conductive pads CP1 and CP may be greater than a width in the first direction D1 of each of the first and second vertical parts VP1 and VP2 of each active pattern AP.

When viewed in plan, the first and second conductive pads CP1 and CP2 may each have a circular shape, an oval shape, a rectangular shape, a square shape, a rhombic shape, a hexagonal shape, or any other suitable shapes. For example, the first and second conductive pads CP1 and CP2 may each have a rectangular shape when viewed in plan.

The first and second conductive pads CP1 and CP2 may be formed of, for example, Al, Cu, Ti, Ta, Ru, W, Mo, Pt, Ni, Co, TiN, TaN, WN, NbN, TiAl, TiAIN, TiSi, TiSiN, TaSi, TaSiN, RuTiN, NiSi, CoSi, IrOx, RuOx, or any combination thereof, but example embodiments are not limited thereto.

A second interlayer dielectric layer 141 may be disposed on the first interlayer dielectric layer 131 and the first and second conductive pads CP1 and CP2.

First and second contact patterns CNT1 and CNT2, respectively coupled to the first and second conductive pads CP1 and CP2, may be provided in the second interlayer dielectric layer 141.

The first contact patterns CNT1 may be disposed in a first column along the first direction D1, and the second contact patterns CNT2 may be arranged in a second row along the first direction D1 and spaced apart in an oblique direction from the first contact patterns CNT1. For example, the first contact patterns CNT1 may be electrically connected through first contact pads CP1 to the first vertical parts VP1 of the active patterns AP, and the second contact patterns CNT2 may be electrically connected through second contact pads CP2 to the second vertical parts VP2 of the active patterns AP.

The first and second contact patterns CNT1 and CNT2 may be formed of, for example, Al, Cu, Ti, Ta, Ru, W, Mo, Pt, Ni, Co, TiN, TaN, WN, NbN, TiAl, TiAIN, TiSi, TiSiN, TaSi, TaSiN, RuTiN, NiSi, CoSi, IrOx, RuOx, or any combination thereof, but example embodiments are not limited thereto.

First and second source lines SL1 and SL2 may extend in the first direction D1 on the second interlayer dielectric layer 141. The first and second source lines SL1 and SL2 may be alternately arranged in the second direction D2. For example, when viewed in plan, one bit line BL may be disposed between a pair of first and second source lines SL1 and SL2.

Each of the first source lines SL1 may be connected to the first contact patterns CNT1 that are arranged along the first direction D1, and each of the second source lines SL2 may be connected to the second contact patterns CNT2 that are arranged along the first direction D1.

For example, the first source lines SL1 may be electrically connected to the first vertical parts VP1 of the active patterns AP, and the second source lines SL2 may be electrically connected to the second vertical parts VP2 of the active patterns AP.

According to some example embodiments, one active pattern AP may be shared by memory cells that are adjacent to each other in the first direction D1, and a potential of one of the first and second vertical parts VP1 and VP2 of the active pattern AP may be controlled by one selected from the first and second word lines WL1 and WL2 and one selected from the first and second source lines SL1 and SL2.

The following will describe a semiconductor memory device according to some example embodiments, and for brevity of description, the same technical features as those of the semiconductor memory device discussed above will be omitted and a difference thereof will be explained.

FIGS. 7, 8, 9, 10, and 11 illustrate cross-sectional views taken along line A-A' of FIG. 4, showing a semiconductor memory device according to some example embodiments.

Figure 7:
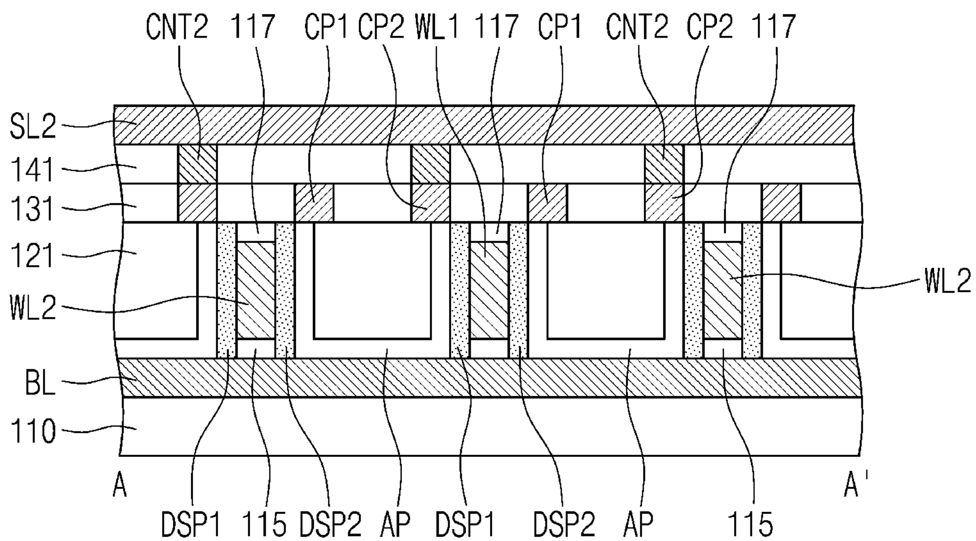
FIGS. 7, 8, 9, 10, and 11 illustrate cross-sectional views taken along line A-A' of FIG. 4, showing a semiconductor memory device according to some example embodiments.

Referring to FIG. 7, upper dielectric patterns 117 may be correspondingly disposed on the top surfaces of the first and second word lines WL1 and WL2. The upper dielectric patterns 117 may be formed of a dielectric material, such as silicon oxide, silicon nitride, or silicon oxynitride. The upper dielectric patterns 117 may have top surfaces that are substantially coplanar with those of the first and second vertical parts VP1 and VP2 of each active pattern AP and those of the first and second data storage patterns DSP1 and DSP2. Therefore, the top surfaces of the first and second vertical parts VP1 and VP2 of each active pattern AP may be higher than those of the word lines WL1 and WL2. In addition, the top surfaces of the first and second data storage patterns DSP1 and DSP2 may be higher than those of the first and second word lines WL1 and WL2.

Figure 8:
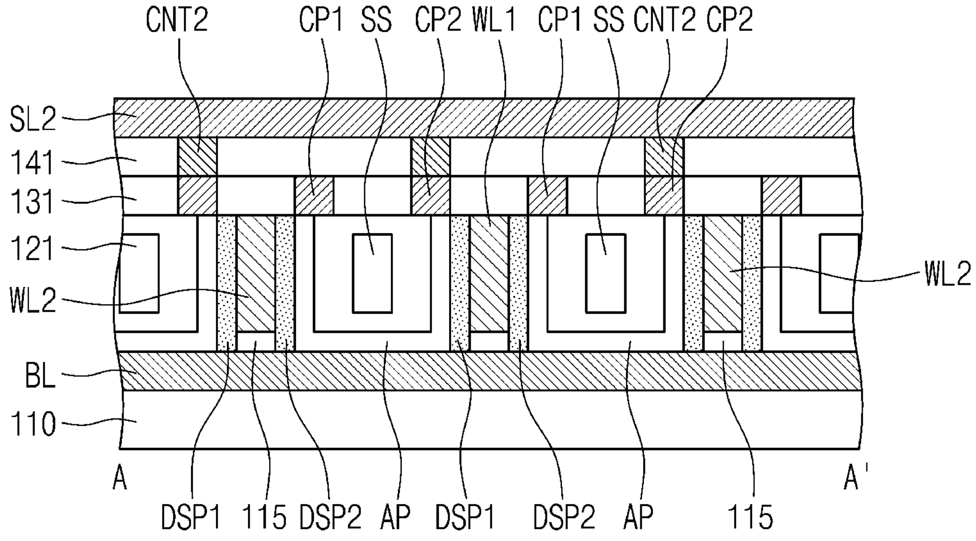

Referring to FIG. 8, the first buried dielectric pattern 121 may include a gap structure SS between the first and second vertical parts VP1 and VP2 of each active pattern AP. The gap structure SS may include an air gap or a metallic material. The gap structure SS may reduce coupling or interference between the first and second vertical parts VP1 and VP2 that face each other.

Figure 9:
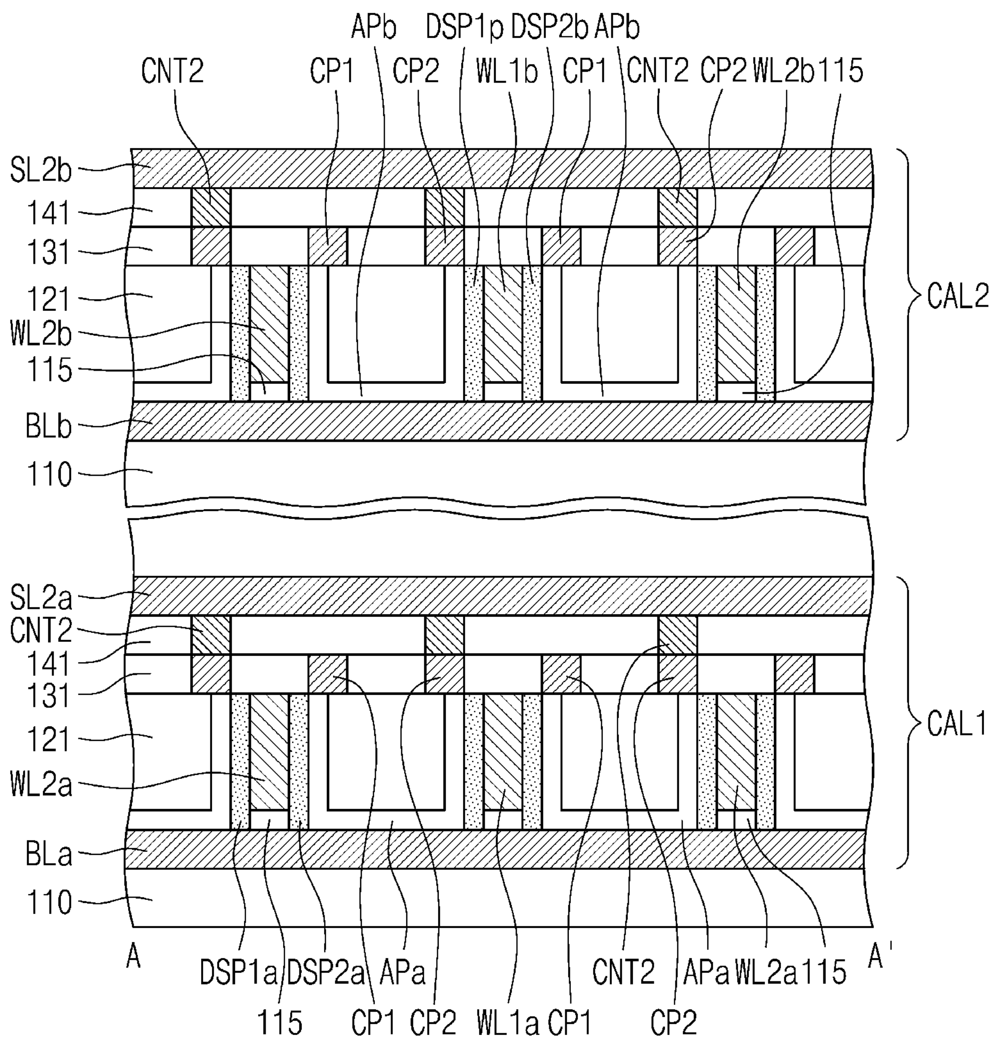

Referring to FIG. 9, a substrate may be provided with a plurality of cell array layers CAL1 and CAL2 that are stacked in a direction perpendicular to a top surface of the substrate. For example, a second cell array layer CAL2 may be disposed on a first cell array layer CAL1. The first and second cell array layers CAL1 and CAL2 may have substantially the same structure. The first and second cell array layers CAL1 and CAL2 may each include two-dimensionally arranged memory cells and may be vertically stacked on each other, and thus a semiconductor memory device may include three-dimensionally arranged memory cells. Accordingly, a semiconductor memory device may have increased integration.

Similar to the above discussion, the first cell array layer CAL1 may include, on its lower dielectric layer 110, lower bit lines BLa, lower first and second word lines WLIa and WL2*a*, lower first and second source lines SL1*a* and SL2*a*, lower first and second data storage patterns DSP1*a* and DSP2*a*, and lower active patterns APa. Similar to the above discussion, each of the lower active patterns APa may have a substantial U between the lower first and second word lines WL1 and WL2.

The second cell array layer CAL2 may be disposed on a lower dielectric layer 110 that covers the lower first and second source lines SL1*a* and SL2*a*. The second cell array layer CAL2 may include upper bit lines BLb, upper first and second word lines WL1*b* and WL2*b*, upper first and second source lines SL1*b* and SL2*b*, upper first and second data storage patterns DSP1*b* and DSP2*b*, and upper active patterns APb. Likewise the lower active patterns APa, each of the upper active patterns APb may have a substantial U shape between the upper first and second word lines WL1*b* and WL2*b*.

Figure 10:
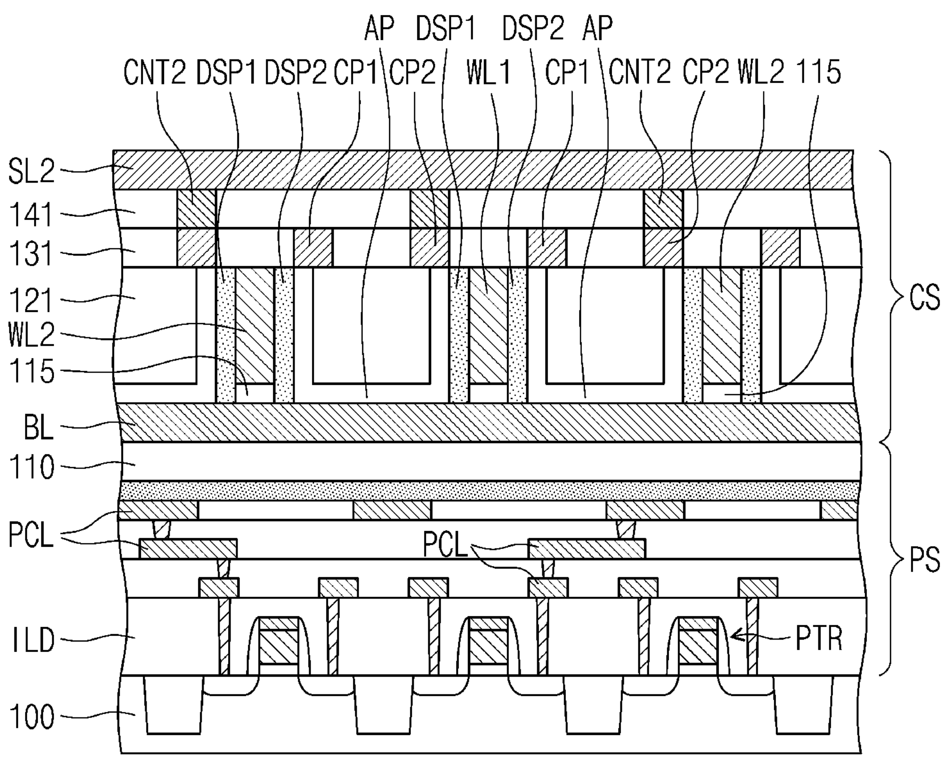

As shown in FIG. 10, a semiconductor memory device may include a peripheral circuit structure PS on a semiconductor substrate 100 and a cell array structure CS on the peripheral circuit structure PS. The semiconductor substrate 100 may be, for example, a monocrystalline silicon substrate.

The peripheral circuit structure PS may be disposed between the semiconductor substrate 100 and the bit line BL. The peripheral circuit structure PS may include core/peripheral circuits PTR formed on the semiconductor substrate 100, peripheral circuit dielectric layers ILD that cover the core/peripheral circuits PTR and are stacked between the semiconductor substrate 100 and the lower dielectric layer 110, and peripheral wiring structures PCL disposed in the peripheral circuit dielectric layers ILD.

The core/peripheral circuits PTR may include row and column decoders (see 2 and 4 of FIG. 1), a sense amplifier (see 3 of FIG. 1), and a control logic (see 5 of FIG. 1) discussed with reference to FIG. 1. For example, the core/peripheral circuits PTR may include NMOS and PMOS transistors that are integrated on the semiconductor substrate 100.

The peripheral wiring structures PCL may include at least two metal patterns and metal plugs that connect the metal patterns to each other.

The core/peripheral circuits PTR may be electrically connected through the peripheral wiring structures PCL to bit lines BL. For example, sense amplifiers may be electrically connected to the bit lines BL, and each sense amplifier may amplify and output a difference in voltage level detected in a pair of bit lines BL.

On the semiconductor substrate 100, the peripheral circuit dielectric layer ILD may cover the core/peripheral circuits PTR and the peripheral wiring structures PCL. The peripheral circuit dielectric layer ILD may include a plurality of stacked dielectric layers. The peripheral circuit dielectric layer ILD may include one or more of a silicon oxide layer, a silicon nitride layer, a silicon oxynitride layer, and a low-k dielectric layer.

As discussed above, the cell array structure CS may include a memory cell array including bit lines BL, first and second word lines WL1 and WL2, first and second data storage patterns DSP1 and DSP2, active patterns AP, and first and second source lines SL1 and SL2.

Figure 11:
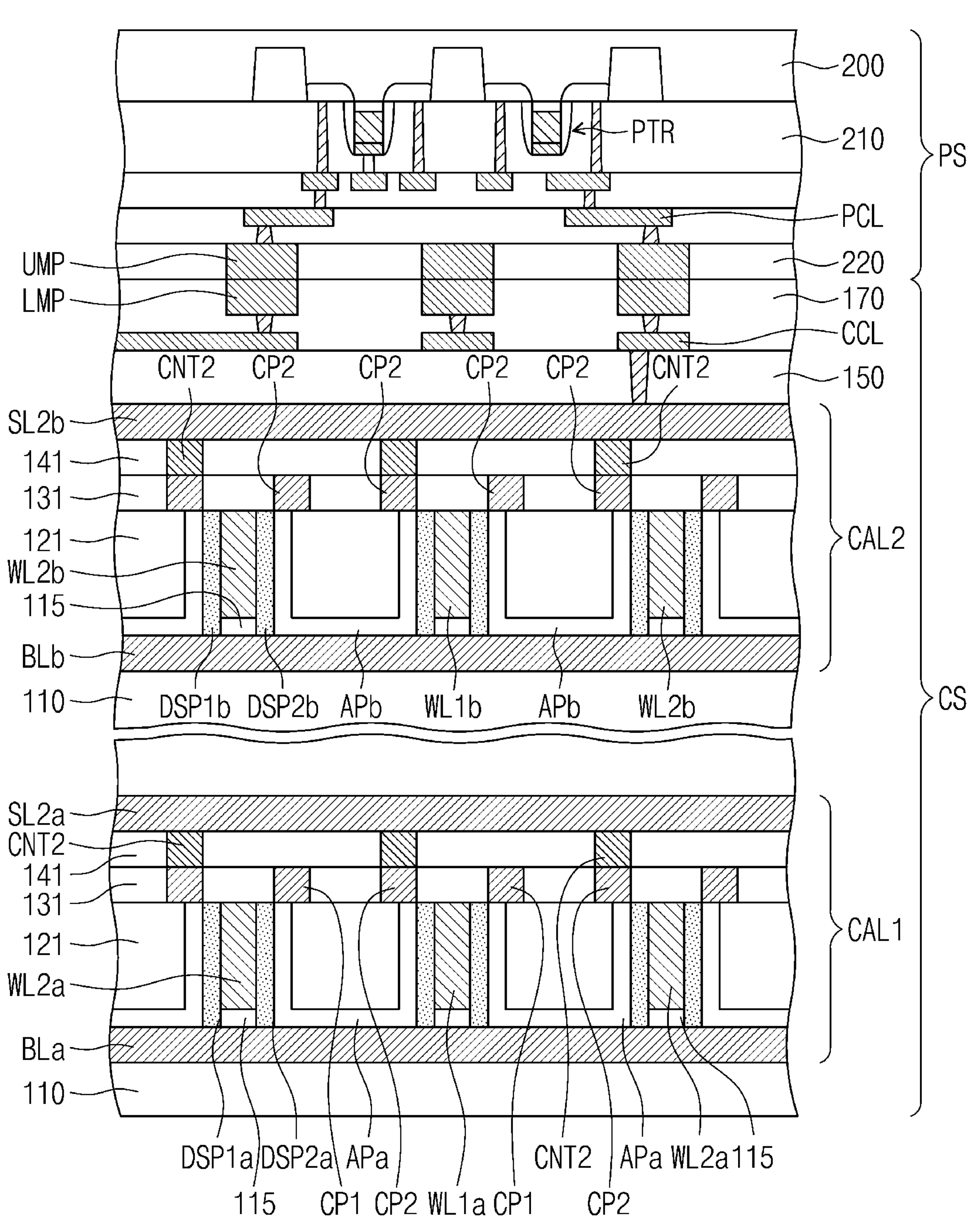

As shown in FIG. 11, a semiconductor memory device may include a cell array structure CS including lower metal pads LMP at an uppermost layer thereof, and may also include a peripheral circuit structure PS including upper metal pads UMP at an uppermost layer thereof.

A bonding method may be employed to electrically and physically connect the lower metal pads LMP of the cell array structure CS to the upper metal pads UMP of the peripheral circuit structure PS. The lower and upper metal pads LMP and UMP may include a metallic material, such as copper (Cu).

As discussed above with reference to FIG. 9, the cell array structure CS may include cell array layers CAL1 and CAL2 that are vertically stacked on a substrate.

As discussed above, each of the cell array layers CAL1 and CAL2 may include bit lines BLa and BLb, word lines WLIa, WL2*a*, WL1*b*, and WL2*b*, and source lines SLa and SLb.

In an uppermost one of the cell array layers CAL1 and CAL2, the source lines SLb may be electrically connected through cell wiring structures CCL to the lower metal pads LMP. The lower metal pads LMP may be disposed in an uppermost dielectric layer 170 of the cell array structure CS.

The peripheral circuit structure PS may include core/peripheral circuits PTR integrated on a second semiconductor substrate 200, peripheral wiring structures PCL electrically connected to the core/peripheral circuits PTR, and upper metal pads UMP electrically connected to the peripheral wiring structures PCL. The upper metal pads UMP may be disposed in an uppermost dielectric layer 220 of the peripheral circuit structure PS.

The lower and upper metal pads LMP and UMP may have substantially the same size and arrangement. The lower and upper metal pads LMP and UMP may include, for example, copper (Cu), aluminum (Al), nickel (Ni), cobalt (Co), tungsten (W), titanium (Ti), tin (Sn), or any alloy thereof.

The semiconductor memory device according to some example embodiments may be fabricated by forming the cell array structure CS including memory cells on a first semiconductor substrate 100, forming the peripheral circuit structure PS including the core/peripheral circuits PTR on the second semiconductor substrate 200 different from the first semiconductor substrate 100, and then using a bonding method to connect the first semiconductor substrate 100 to the second semiconductor substrate 200. For example, a bonding method may be employed to electrically and physically connect the lower metal pads LMP of the peripheral circuit structure PS to the upper metal pads UMP of the cell array structure CS. Thus, the lower metal pads LMP may be in direct contact with the upper metal pads UMP.

Figure 12:
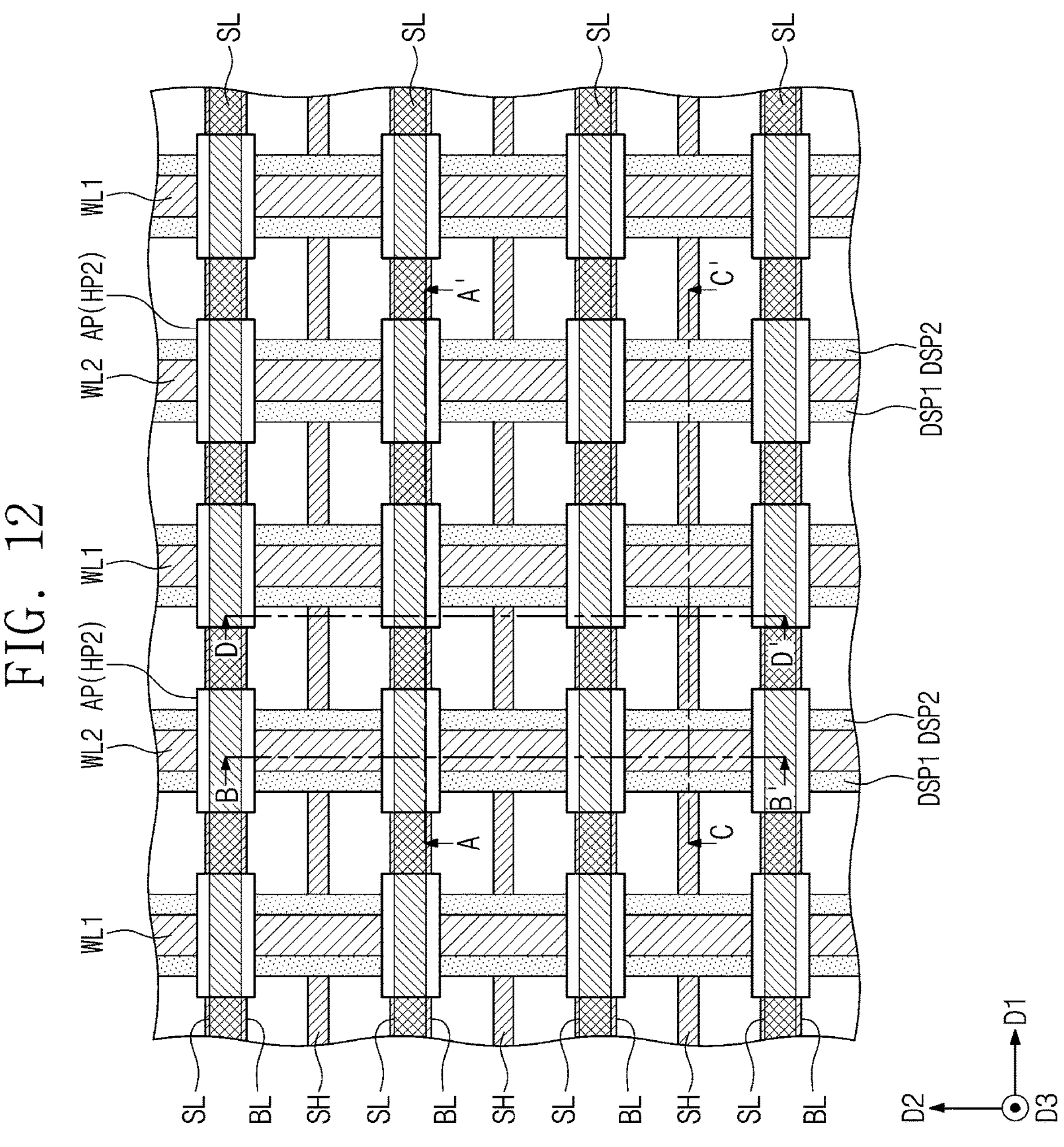
FIG. 12 illustrates a plan view showing a semiconductor memory device according to some example embodiments.
Figure 13A:
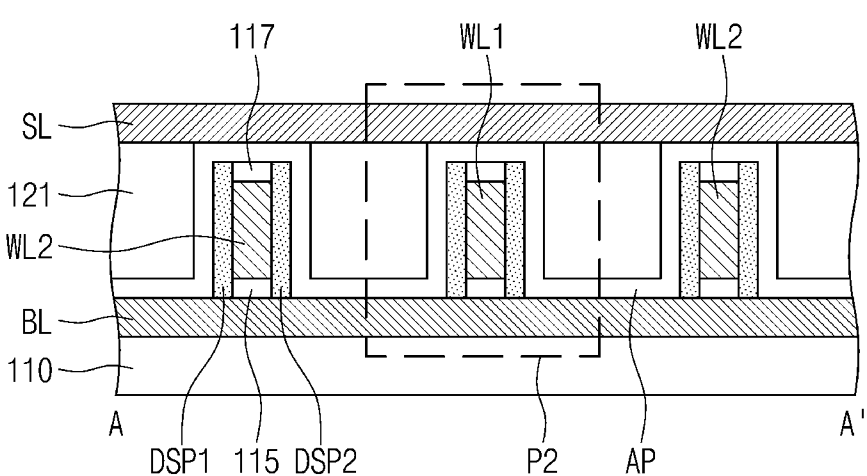
FIGS. 13A and 13B illustrate cross-sectional views taken along lines A-A' and B-B' of FIG. 12, showing a semiconductor memory device according to some example embodiments.
Figure 13B:
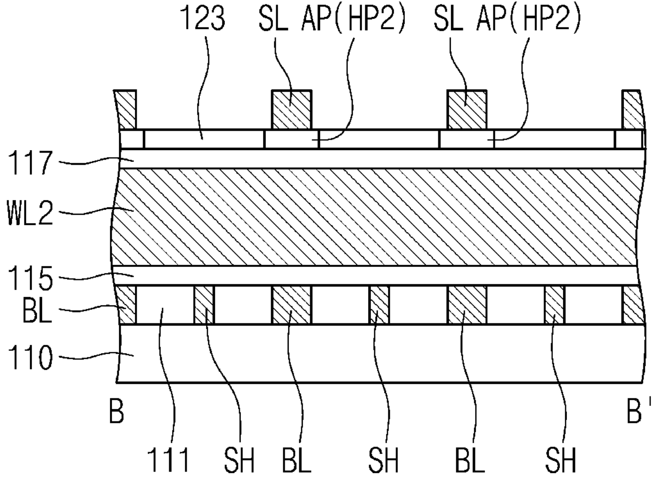
Figure 14:
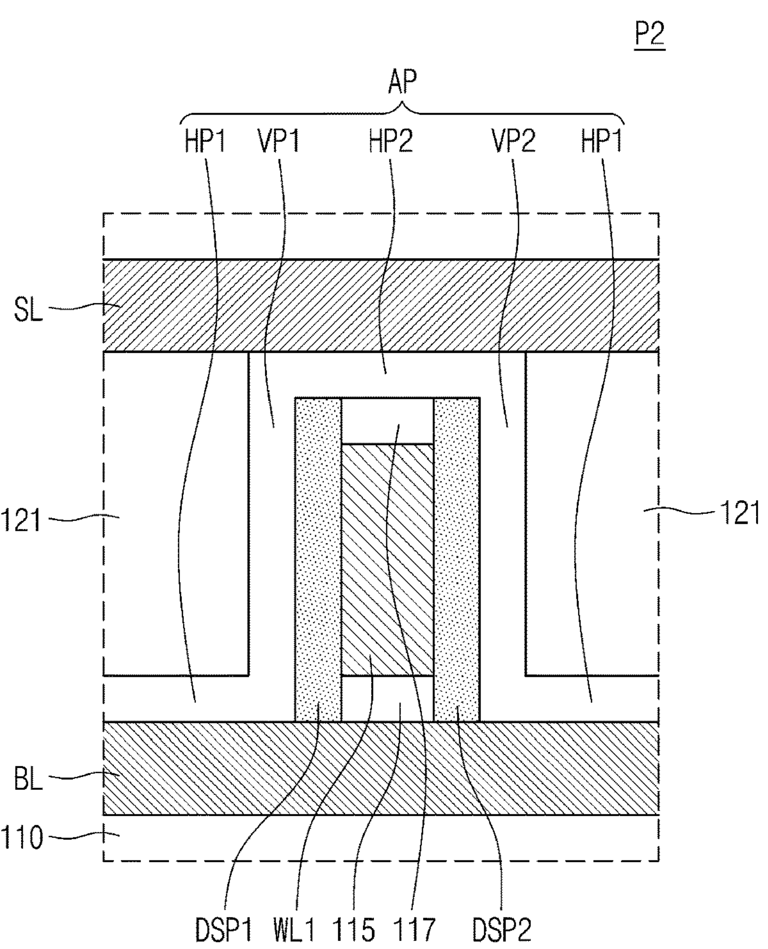
FIG. 14 illustrates an enlarged view showing section P2 of FIG. 13A.

FIG. 12 illustrates a plan view showing a semiconductor memory device according to some example embodiments. FIGS. 13A and 13B illustrate cross-sectional views taken along lines A-A' and B-B' of FIG. 12, showing a semiconductor memory device according to some example embodiments. FIG. 14 illustrates an enlarged view showing section P2 of FIG. 13A. Omission will be made to avoid a description of the same technical characteristics as those of the semiconductor memory device discussed above with reference to FIGS. 4, 5A, 5B, 5C, and 5D.

Referring to FIGS. 12, 13A, and 13B, a semiconductor memory device may include bit lines BL, first and second word lines WL1 and WL2, active patterns AP, first and second data storage patterns DSP1 and DSP2, and source lines SL.

The bit lines BL may extend in a first direction D1 on a lower dielectric layer 110 and may be disposed spaced apart from each other in a second direction D2. On the lower dielectric layer 110, shield lines SH may be correspondingly disposed between the bit lines BL. A buried dielectric layer 111 may fill spaces between the bit lines BL and the shield lines SH.

The first and second word lines WL1 and WL2 may extend in the second direction D2 and cross the bit lines BL, and may be alternately disposed along the first direction D1. Each of the first and second word lines WL1 and WL2 may have a first sidewall and a second sidewall that are opposite to each other.

Lower dielectric patterns 115 may be disposed between the bit lines BL and bottom surfaces of the first and second word lines WL1 and WL2, and upper dielectric patterns 117 may be disposed on top surfaces of the first and second word lines WL1 and WL2.

According to some example embodiments, the active patterns AP may be correspondingly disposed on the bit lines BL. The active patterns AP may extend in the first direction D1 parallel to the bit line BL and may be spaced apart from each other in the second direction D2. Each active pattern AP may have a substantially uniform thickness, and may cover the top surface and opposite sidewalls of one of the first and second word lines WL1 and WL2.

For example, referring to FIG. 14, each active pattern AP may include a first horizontal part HP disposed on the bit line BL, first and second vertical parts VP1 and VP2 that protrude in a third direction D3 from the first horizontal part HP, and a second horizontal part HP2 through which the first and second vertical parts VP1 and VP1 are connected to each other on the first and second word lines WL1 and WL2.

The first vertical part VP1 may be disposed on first sidewalls of the first and second word lines WL1 and WL2, and the second vertical part VP2 may be disposed on second sidewalls of the first and second word lines WL1 and WL2.

The first and second data storage patterns DSP1 and DSP2 may be disposed between the first and second word lines WL1 and WL2 and the first and second vertical parts VP1 and VP2 of the active patterns AP. The first and second data storage patterns DSP1 and DSP2 may be disposed on opposite sidewalls of each of the first and second word lines WL1 and WL2.

A first buried dielectric pattern 121 may be disposed between the first and second vertical parts VP1 and VP2 of the active pattern AP, and a top surface of the first buried dielectric pattern 121 may be substantially coplanar with that of the second vertical part VP2 of the active pattern AP.

The source lines SL may extend in a first direction D1 on the first buried dielectric pattern 121 and the active patterns AP. When viewed in plan, the source lines SL may correspondingly overlap the bit lines BL. The source lines SL may be correspondingly in direct contact with the second horizontal parts HP2 of the active patterns AP.

According to some example embodiments, when the semiconductor memory device operates, one memory cell may be chosen by one selected from the bit lines BL, one selected from the source lines SL, and one selected from the first and second word lines WL1 and WL2. In addition, each of the first and second word lines WL1 and WL2 may simultaneously control potentials of the first and second vertical parts VP1 and VP2 of the active pattern AP. For example, as one memory cell has a vertical channel on opposite sides of each word line WL1 or WL2, and thus when the semiconductor memory device operates, the semiconductor memory device may have an increased operating current and a large memory window.

Figure 15:
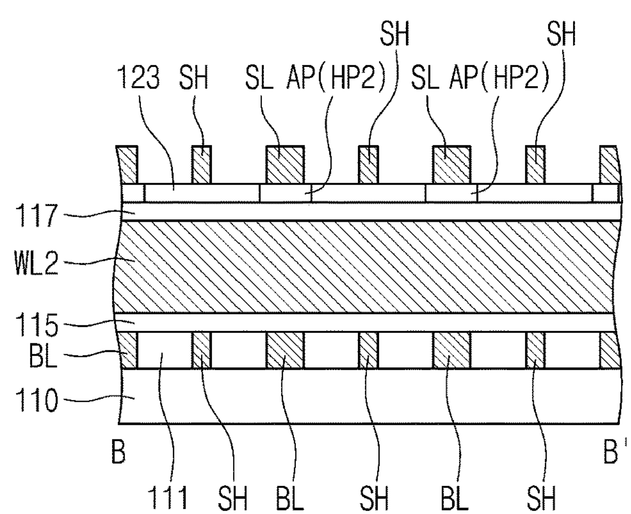
FIG. 15 illustrates a cross-sectional view taken along line B-B' of FIG. 12, showing a semiconductor memory device according to some example embodiments.

FIG. 15 illustrates a cross-sectional view taken along line B-B' of FIG. 12, showing a semiconductor memory device according to some example embodiments. For brevity of description, the following will focus on differences from the semiconductor memory device discussed above with reference to FIGS. 12, 13A, and 13B.

Referring to FIG. 15, similar to the bit lines BL, the shield lines SH may be correspondingly disposed between the source lines SL.

The shield lines SH may be disposed at the same distance from the source lines SL. For example, a regular interval may be provided between the shield lines SH and the source lines SL. The shield lines SH may include the same material as that of the source lines SL and may each have a line-width less than that of each of the source lines SL.

FIGS. 16A, 17A, 18A, 19A, 20A and 21A illustrate plan views showing a method of fabricating a semiconductor memory device according to some example embodiments. FIGS. 16B, 17B, 18B, 19B, 20B and 21B illustrate cross-sectional views taken along line A-A' of FIGS. 16A to 21A, showing a method of fabricating a semiconductor memory device according to some example embodiments.

Figure 16A:
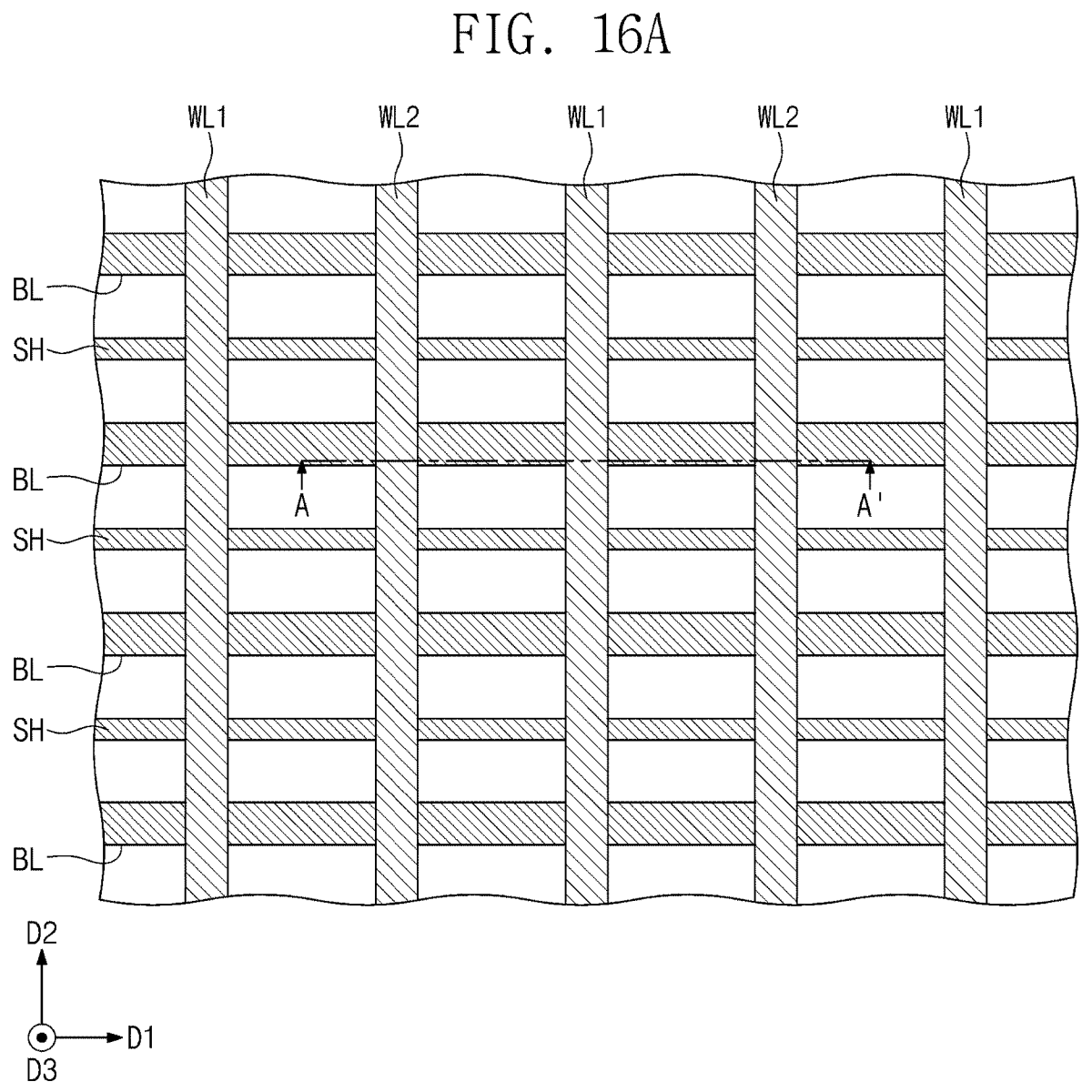
Figure 16B:
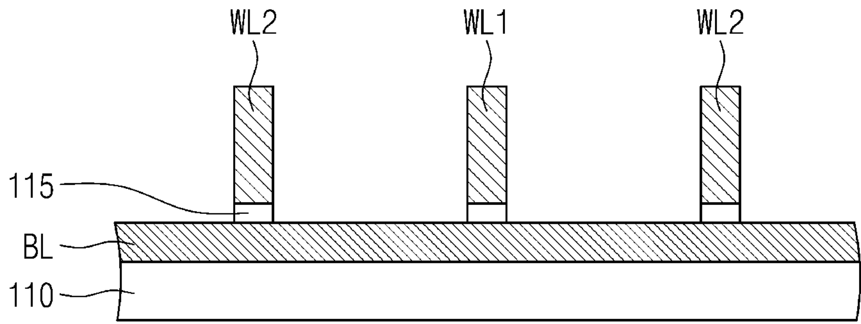
FIGS. 16B, 17B, 18B, 19B, 20B and 21B illustrate cross-sectional views taken along line A-A' of FIGS. 16A to 21A, showing a method of fabricating a semiconductor memory device according to some example embodiments.

Referring to FIGS. 16A and 16B, bit lines BL extending in a direction D1 may be formed on a lower dielectric layer 110.

The lower dielectric layer 110 may cover a semiconductor substrate and may include a plurality of stacked dielectric layers. For example, the lower dielectric layer 110 may include one or more of a silicon oxide layer, a silicon nitride layer, a silicon oxynitride layer, and a low-k dielectric layer.

The bit lines BL may be formed by depositing a conductive layer on the lower dielectric layer 110, and then patterning the conductive layer. A buried dielectric layer 111 may fill spaces between the bit lines BL, and the buried dielectric layer 111 may have a top surface substantially coplanar with those of the bit lines BL. Alternatively, the bit lines BL may be formed by forming trenches in the buried dielectric layer 111, and then filling the trenches with a conductive material.

When the lower dielectric layer 110 covers peripheral circuits as shown in FIG. 10, the bit lines BL may be connected to contact plugs connected with the peripheral circuits in the lower dielectric layer 110.

When the buried dielectric layer 111 is formed, the shield lines SH may be correspondingly formed between the bit lines BL. For example, the shield lines SH may be formed simultaneously with the bit lines BL. The shield lines SH may be formed in a patterning process for forming the bit lines BL. The shield lines SH may each have a width less than that of each of the bit lines BL, and may be equally spaced apart from the bit lines BL.

Afterwards, word lines WL1 and WL2 may be formed to cross the bit lines BL and the shield lines SH.

For example, the formation of the word lines WL1 and WL2 may include forming a dielectric layer that covers top surfaces of the bit lines BL and top surfaces of the shield lines SH, forming a conductive layer on the dielectric layer, forming a mask pattern on the conductive layer, and using the mask pattern as an etching mask to sequentially etch the conductive layer and the dielectric layer. Therefore, the word lines WL1 and WL2 and lower dielectric patterns 115 may be formed to extend in a second direction D2 on the bit lines BL. The formation of the word lines WL1 and WL2 and the lower dielectric patterns 115 may expose the top surfaces of portions of the bit lines BL on opposite sides of each of the word lines WL1 and WL2. The lower dielectric patterns 115 may have sidewalls that are aligned with those of the word lines WL1 and WL2.

Figure 17A:
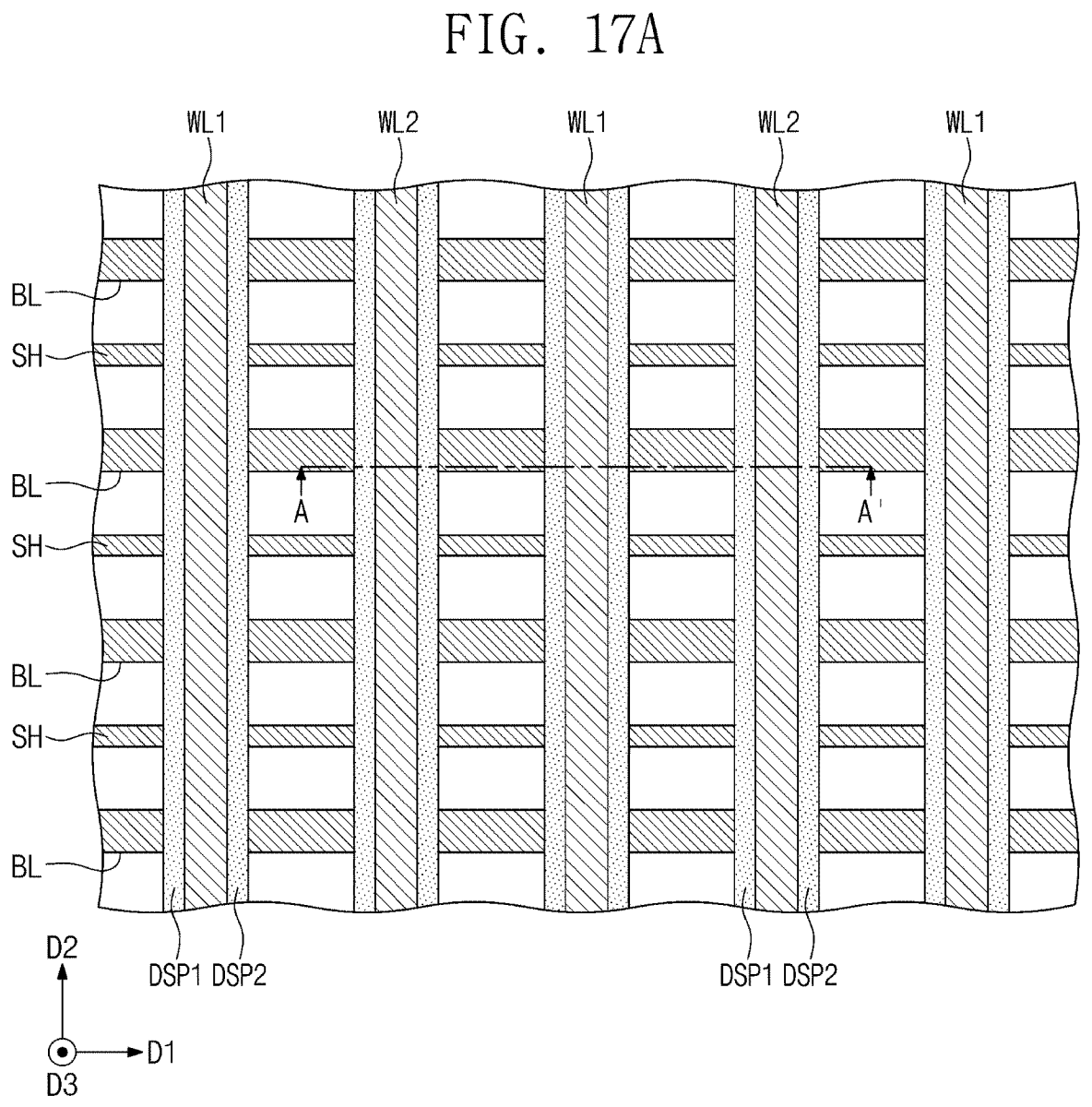
Figure 17B:
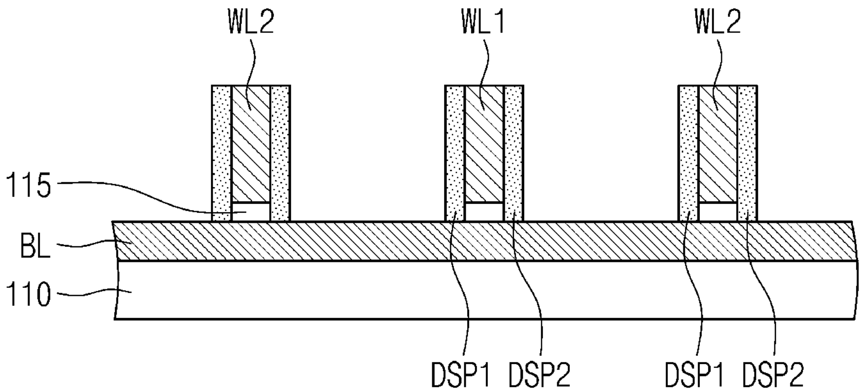

Referring to FIGS. 17A and 17B, data storage patterns DSP1 and DSP2 may be formed on opposite sidewalls of each of the word lines WL1 and WL2.

The formation of the data storage patterns DSP1 and DSP2 may include depositing on an entire surface of the lower dielectric layer 110 a data storage layer having a uniform thickness after the formation of the word lines WL1 and WL2, and then performing a blanket etching process on the data storage layer.

The data storage layer may be deposited by using thermal chemical vapor deposition (CVD), plasma enhanced thermal chemical vapor deposition (plasma enhanced CVD), physical thermal chemical vapor deposition (physical CVD), or atomic layer deposition (ALD). According to some example embodiments, the data storage layer may include a ferroelectric material. The data storage layer may be formed by depositing, for example, a dielectric material including hafnium. The ferroelectric layer may include, for example, $HfO_2$, $HfSiO_2$ (Si-doped $HfO_2$), $HfAlO_2$ (Al-doped $HfO_2$), HfSiON, HfZnO, $HfZrO_2$, $ZrO_2$, $ZrSiO_2$, $HfZrSiO_2$, ZrSiON, LaAlO, $HfDyO_2$, or $HfScO_2$.

As the data storage layer undergoes a blanket etching process, or etch-back process, the data storage layer may be removed from the top surfaces of the word lines WL1 and WL2 and between the word lines WL1 and WL2. Therefore, portions of the bit lines BL may be exposed at the top surfaces thereof, and the data storage patterns DSP1 and DSP2 may be formed on the opposite sidewalls of each of the word lines WL1 and WL2. For example, the data storage patterns DSP1 and DSP2 may extend in the second direction D2 along the opposite sidewalls of each of the word lines WL1 and WL2.

It is illustrated that the data storage patterns DSP1 and DSP2 have flat top surfaces, but example embodiments are not limited thereto and, for example, the blanket etching process may cause the data storage patterns DSP1 and DSP2 to have rounded top surfaces.

Figure 18A:
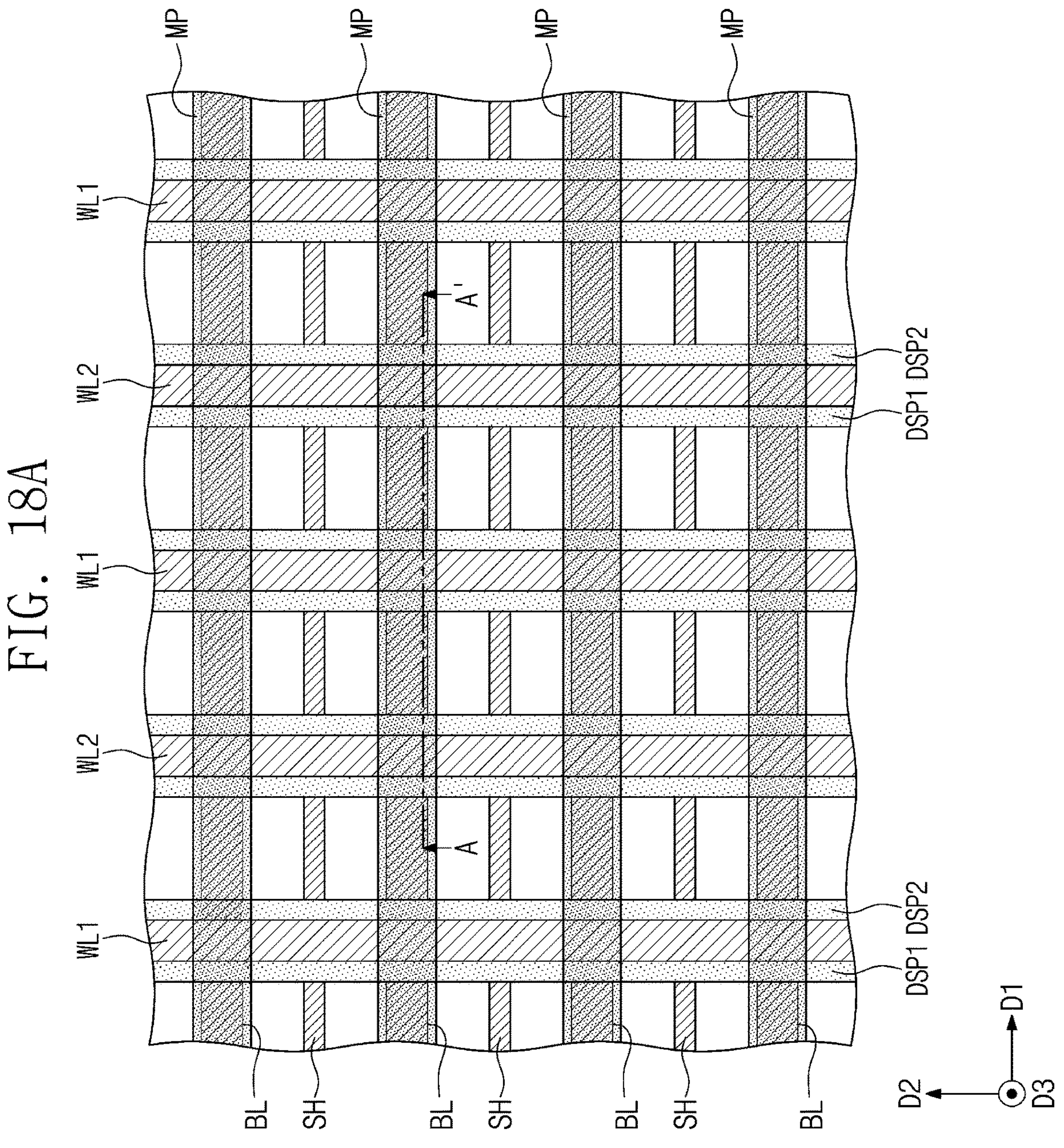
Figure 18B:
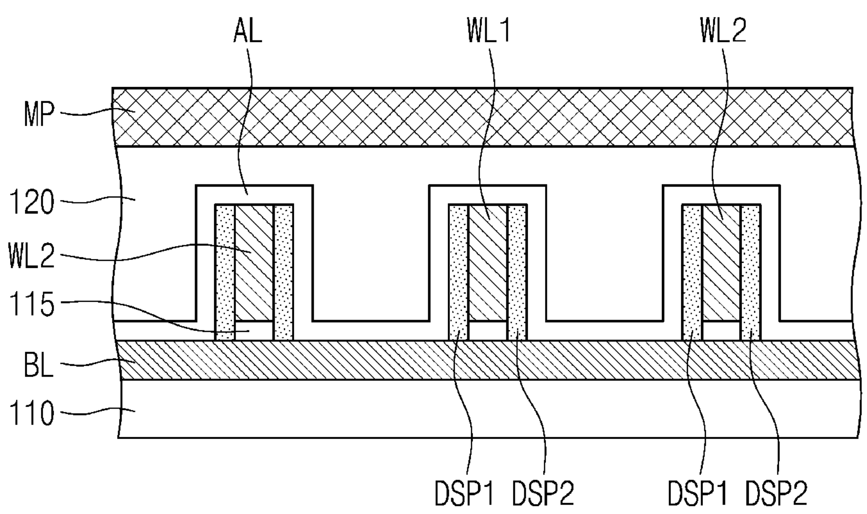

Referring to FIGS. 18A and 18B, after the formation of the data storage patterns DSP1 and DSP2, an active layer AL may be deposited to have a uniform thickness on the entire surface of the lower dielectric layer 110.

The active layer AL may cover the top surfaces of the bit lines BL and the top surfaces of the shield lines SH between the data storage patterns DSP1 and DSP2, and may cover sidewalls of the data storage patterns DSP1 and DSP2 and the top surfaces of the word lines WL1 and WL2.

The active layer AL may be formed by using at least one selected from physical vapor deposition (PVD), thermal chemical deposition process (thermal CVD), low pressure chemical vapor deposition (LPCVD), plasma enhanced chemical vapor deposition (PECVD), and atomic layer deposition (ALD).

The active layer AL may be deposited to have a thickness less than half an interval between neighboring data storage patterns DSP1 and DSP2. Therefore, the active layer AL may define a recess region that extends in the second direction D2 between neighboring word lines WL1 and WL2.

The active layer AL may include a semiconductor material, an oxide semiconductor material, or a two-dimensional semiconductor material. The active layer AL may include, for example, silicon, germanium, silicon-germanium, or indium gallium zinc oxide (IGZO).

A first buried dielectric layer 120 may be formed on the active layer AL, filling the recess region. The first buried dielectric layer 120 may have a substantially flat top surface. A thickness of the first buried dielectric layer 120 between the word lines WL1 and WL2 may be different from that of the first buried dielectric layer 120 on the word lines WL1 and WL2.

The first buried dielectric layer 120 may be formed of a dielectric material having an etch selectivity with respect to the data storage patterns DSP1 and DSP2 and the word lines WL1 and WL2. For example, the first buried dielectric layer 120 may be one of dielectric materials and silicon oxides that are formed by using spin-on-glass (SOG) technology.

A mask pattern MP may be formed to have a line-and-space shape that extends in the first direction D1 on the first buried dielectric layer 120. When viewed in plan, the mask pattern MP may overlap each bit line BL.

The mask pattern MP may be used as an etching mask to perform an anisotropic etching process on the first buried dielectric layer 120 and the active layer AL. Thus, when viewed in plan, the active layer AL may be patterned to have a linear shape that extends in the first direction D1. In addition, an anisotropic etching process performed on the active layer AL may expose the top surfaces of the buried dielectric layer 111 and the shield lines SH between the mask patterns MP that are adjacent to each other in the second direction D2.

Afterwards, the mask pattern MP may be removed, and then a second buried dielectric layer may fill a space between the line-shaped active layers AL.

Figure 19A:
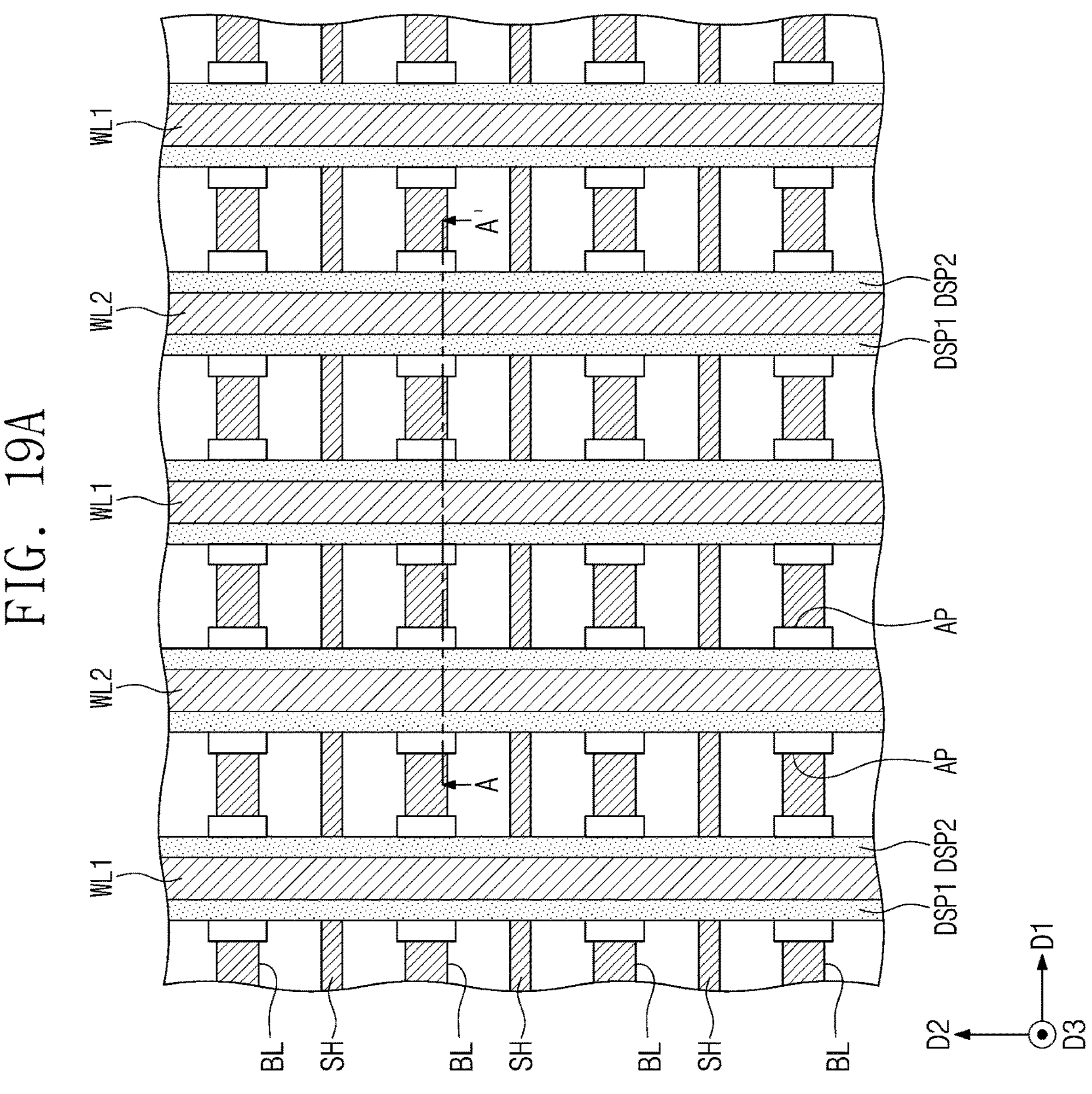
Figure 19B:
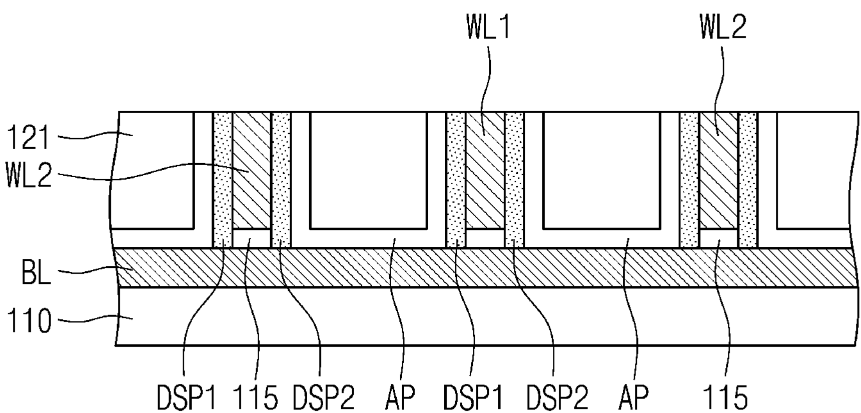

Referring to FIGS. 19A and 19B, a planarization process may be performed on the first buried dielectric layer 120, the second buried dielectric layer, and the active layer AL. The planarization process may continue until the top surfaces of the word lines WL1 and WL2 and the first and second data storage patterns DSP1 and DSP2 are exposed.

Figure 20A:
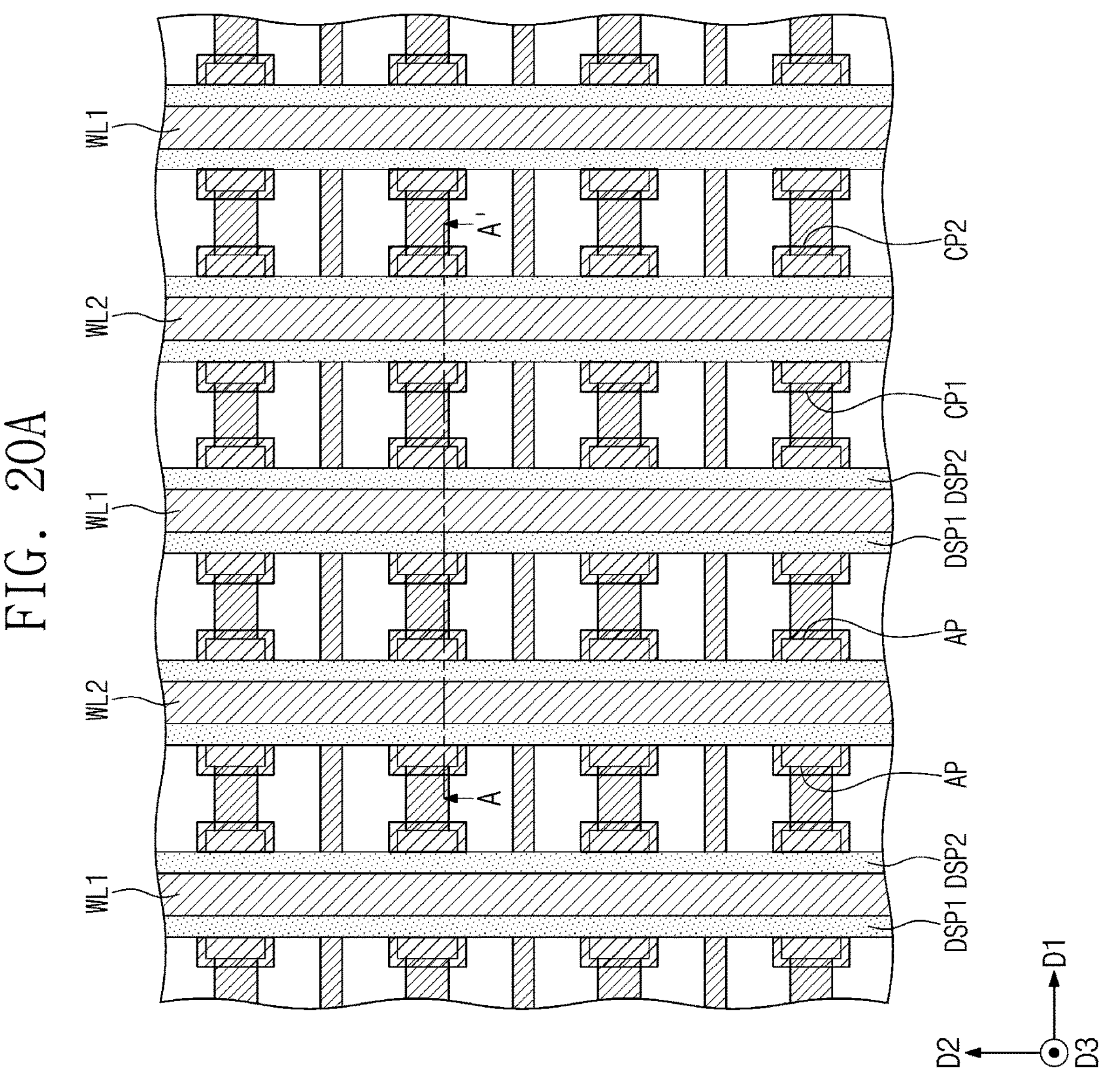
Figure 20B:
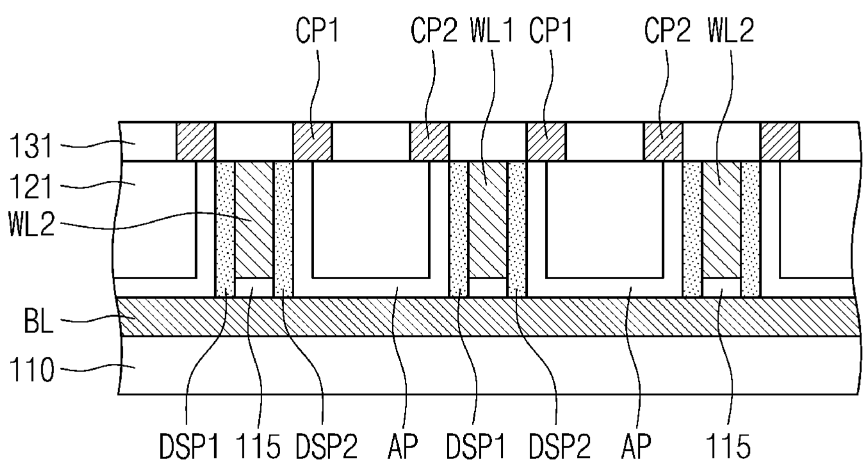

Referring to FIGS. 20A and 20B, a first interlayer dielectric layer 131 may be formed on first and second buried dielectric layers 121 and 123, and first and second conductive pads CP1 and CP2 may be formed in the first interlayer dielectric layer 131.

The first and second conductive pads CP1 and CP2 may be formed by patterning the first interlayer dielectric layer 131 to form openings that expose vertical parts of each active pattern AP, and then filling the openings with a conductive material.

Figure 21A:
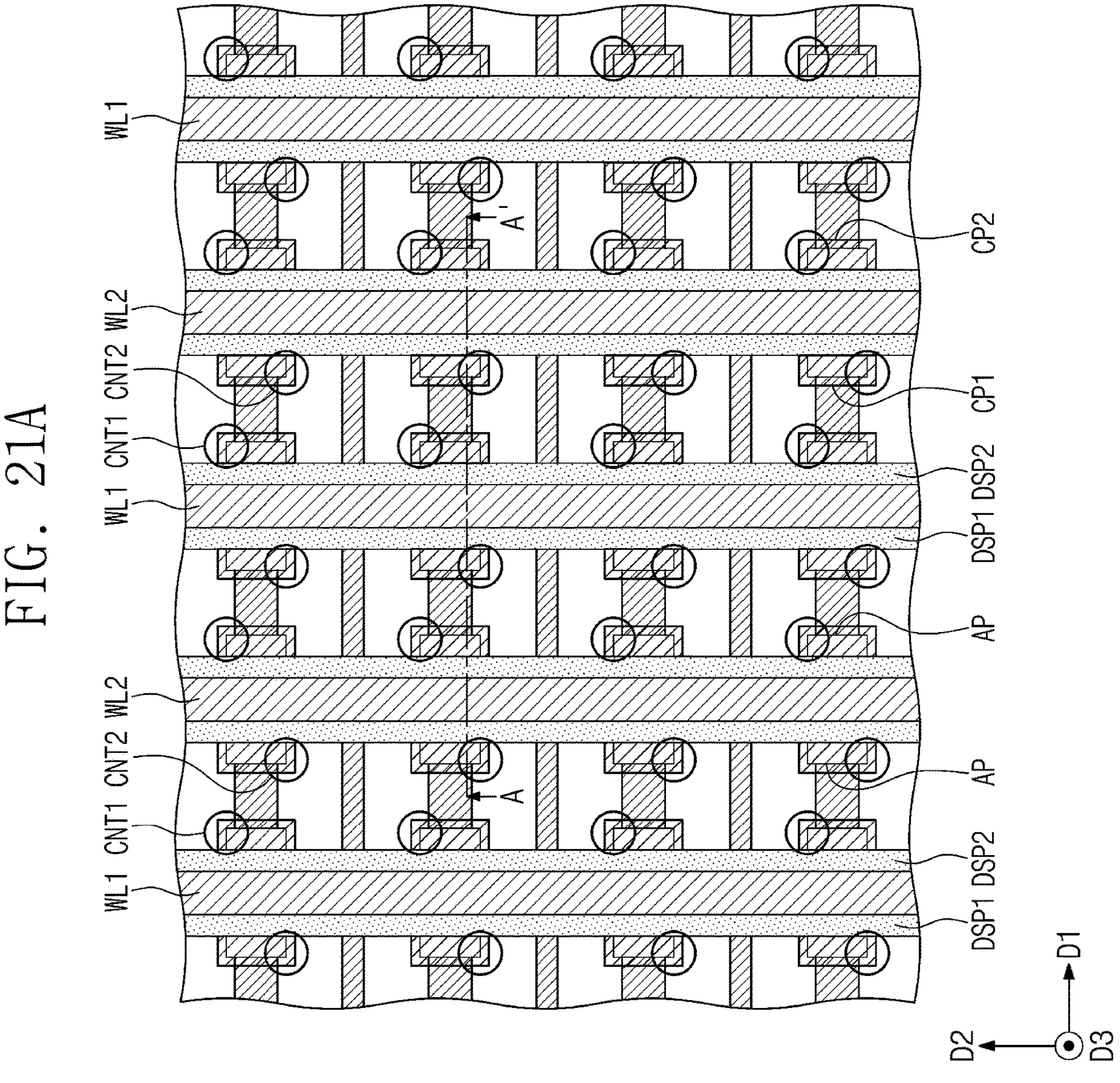
Figure 21B:
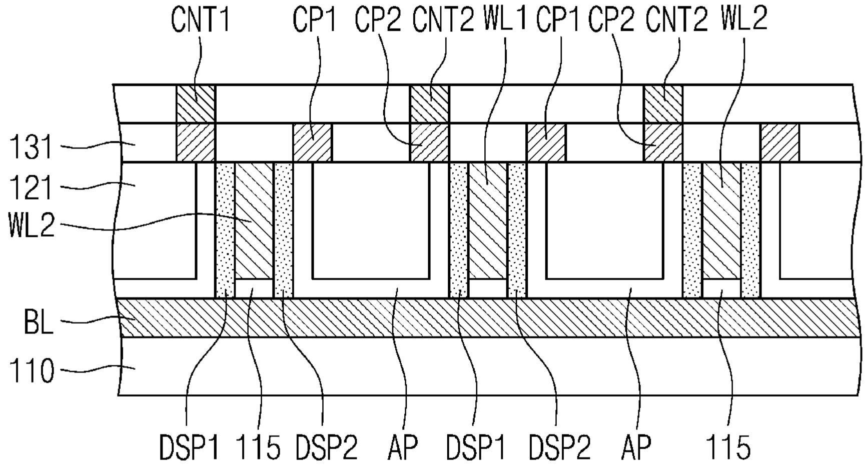

Referring to FIGS. 21A and 21B, a second interlayer dielectric layer 141 may be formed on the first interlayer dielectric layer 131, and first and second contact patterns CNT1 and CNT2 may be formed in the second interlayer dielectric layer 141.

The first and second contact patterns CNT1 and CNT2 may be formed by forming contact holes that penetrate the second interlayer dielectric layer 141 to expose portions of the first and second conductive pads CP1 and CP2, and then filing the contact holes with a conductive material.

Thereafter, as discussed with reference to FIGS. 4, 5A, 5B, 5C, and 5D, first and second source lines SL1 and SL2 may be formed on the second interlayer dielectric layer 141. The first and second source lines SL1 and SL2 may be formed by depositing a conductive layer on the second interlayer dielectric layer 141, and then patterning the conductive layer.

Figure 22A:
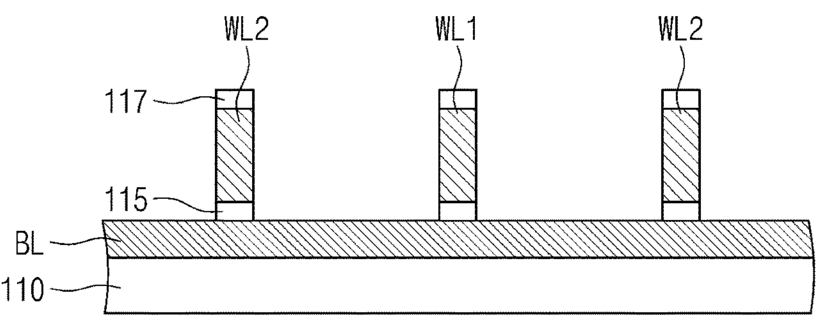
FIGS. 22A, 22B, and 22C illustrate cross-sectional views taken along line A-A' of FIG. 12, showing a method of fabricating a semiconductor memory device according to some example embodiments.
Figure 22B:
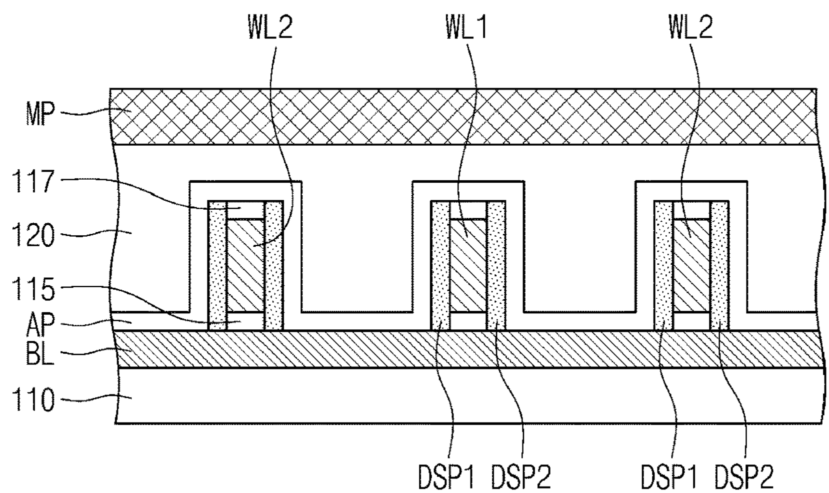
Figure 22C:
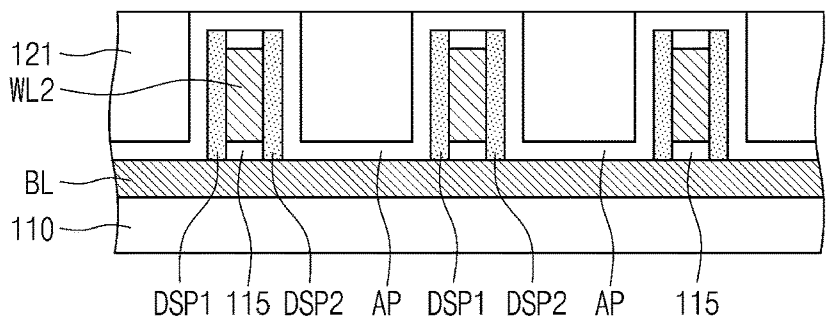

FIGS. 22A, 22B, and 22C illustrate cross-sectional views taken along line A-A' of FIG. 12, showing a method of fabricating a semiconductor memory device according to some example embodiments.

Referring to FIGS. 12 and 22A, bit lines BL and shield lines SH may be formed on the lower dielectric layer 110, and then word lines WL1 and WL2 may be formed to cross the bit lines BL.

The formation of the word lines WL1 and WL2 may include sequentially depositing a first dielectric layer, a conductive layer, and a second dielectric layer on top surfaces of the bit lines BL and the shield lines SH, forming a mask pattern on the second dielectric layer, and using the mask pattern as an etching mask to sequentially etch the second dielectric layer, the conductive layer, and the first dielectric layer. Therefore, upper dielectric patterns 117, the word lines WL1 and WL2, and lower dielectric patterns 115 may be formed to extend in the second direction D2 on the bit lines BL. The lower and upper dielectric patterns 115 and 117 may have sidewalls that are aligned with those of the word lines WL1 and WL2.

Referring to FIGS. 12 and 22B, as discussed above with reference to FIGS. 17A and 17B, first and second data storage patterns DSP1 and DSP2 may be formed on opposite sidewalls of each of first and second word lines WL1 and WL2. As discussed above with reference to FIGS. 18A and 18B, after the formation of the first and second data storage patterns DSP1 and DSP2, an active layer AL and a first buried dielectric layer 120 may be formed. The line-shaped mask pattern MP may be used as an etching mask to etch the first buried dielectric layer 120 and the active layer AL. Therefore, there may be formed active patterns AP that extend in the first direction D1.

Referring to FIGS. 12 and 22C, after the mask pattern MP is removed, a second buried dielectric layer may fill a space between the line-shaped active layers AL, and the first buried dielectric layer 120 and the second buried dielectric layer may undergo a planarization process to expose the active patterns AP on top surfaces of the first and second word lines WL1 and WL2. Therefore, first buried dielectric pattern 121 may be formed between vertical parts of the active patterns AP, and a top surface of each active pattern AP may be exposed.

After that, source lines SL may be formed on the first buried dielectric patterns 121 to contact portions of the active patterns AP.

According to some example embodiments, a data storage pattern may be formed which includes a ferroelectric material, and then an active pattern may be formed, which may result in a reduction in formation of a native oxide layer at an interface between the active pattern and the data storage pattern. Therefore, it may be possible to improve operating properties of memory cells and reliability of semiconductor memory devices.

In addition, when a single word line is shared by a pair of neighboring memory cells, a semiconductor memory device may increase in integration. Moreover, when an active pattern is disposed on opposite sides of one word line, it may be possible to increase an operating current and to obtain a large memory window.

While aspects of example embodiments have been particularly shown and described, it will be understood that various changes in form and details may be made therein without departing from the spirit and scope of the following claims.

What is claimed is:

1. A semiconductor memory device, comprising:

a bit line that extends in a first direction;

a first word line that extends in a second direction and crosses the bit line;

a second word line that is spaced apart from the first word line, extends in the second direction and crosses the bit line;

an active pattern on the bit line between the first word line and the second word line, the active pattern comprising a first vertical part and a second vertical part that are opposite to each other, and a horizontal part that extends between the first vertical part and the second vertical part;

a first data storage pattern between the first word line and the first vertical part of the active pattern;

a second data storage pattern between the second word line and the second vertical part of the active pattern; and a source line connected to the active pattern, the source line extending the first direction and crossing the first word line and the second word line.

2. The semiconductor memory device of claim 1, wherein the active pattern comprises an oxide semiconductor.

3. The semiconductor memory device of claim 1, wherein the first data storage pattern and the second data storage pattern comprise a ferroelectric material.

4. The semiconductor memory device of claim 1, wherein the first data storage pattern and the second data storage pattern extend in the second direction on the bit line.

5. The semiconductor memory device of claim 1, wherein, when viewed in vertical section, the first word line and the second word line are between the bit line and the source line.

6. The semiconductor memory device of claim 1, wherein the source line is electrically connected to the first vertical part or the second vertical part of the active pattern.

7. The semiconductor memory device of claim 1, wherein top surfaces of the first vertical part and a the second vertical part are substantially coplanar with top surfaces of the first data storage pattern and the second data storage pattern.

8. The semiconductor memory device of claim 1, wherein top surfaces of the first data storage pattern and the second data storage pattern are substantially coplanar with top surfaces of the first word line and the second word line.

9. A semiconductor memory device, comprising a plurality of cell array layers that are vertically stacked on a lower dielectric layer, wherein each of the plurality of cell array layers comprises:

a bit line that extends in a first direction;

a first word line that extends in a second direction and crosses the bit line;

a second word line that is spaced apart from the first word line, extends in the second direction and crosses the bit line;

an active pattern on the bit line between the first word line and the second word line, the active pattern comprising a first vertical part and a second vertical part that are opposite to each other, and a horizontal part that extends between the first vertical part and the second vertical part;

a first data storage pattern between the first word line and the first vertical part of the active pattern;

a second data storage pattern between the second word line and the second vertical part of the active pattern; and a source line that extends in the first direction and crosses the first word line and the second word line.

10. The semiconductor memory device of claim 1, wherein the first data storage pattern contacts the bit line.

11. The semiconductor memory device of claim 10, wherein the second data storage pattern contacts the bit line.

12. The semiconductor memory device of claim 1, wherein a top surface of the first word line and a top surface of the first vertical part are at a same level.

13. The semiconductor memory device of claim 1, wherein a top surface of the first word line, a top surface of the first vertical part, a top surface of the second word line and a top surface of the second vertical part are at a same level.

14. The semiconductor memory device of claim 1, wherein the first data storage pattern is on a first sidewall of the first word line, and wherein the semiconductor memory device further comprises a third data storage pattern on a side sidewall of the first word line.

15. A semiconductor memory device comprising:

a bit line that extends in a first direction;

a first word line and a second word line that extend in a second direction and cross the bit line;

an active pattern on the bit line between the first word line and the second word line, the active pattern comprising a first vertical part and a second vertical part that are opposite to each other, and a horizontal part that extends between the first vertical part and the second vertical part;

a first data storage pattern between the first word line and the first vertical part of the active pattern;

a second data storage pattern between the second word line and the second vertical part of the active pattern;

a source line connected to the active pattern, the source line extending the first direction and crossing the first word line and the second word line; and lower dielectric patterns that extend in the second direction between a top surface of the bit line and bottom surfaces of the first word line and the second word line.

16. The semiconductor memory device of claim 1, further comprising:

a first contact pad coupled to the first vertical part of the active pattern;

a second contact pad coupled to the second vertical part of the active pattern;

a first contact pattern coupled to the first contact pad; and a second contact pattern coupled to the second contact pad, wherein, when viewed in plan, the first contact pattern and the second contact pattern are spaced apart from each other across the bit line.

17. The semiconductor memory device of claim 16, wherein the source line comprises:

a first source line that extends in the first direction and is connected to the first contact pattern; and a second source line that extends in the first direction and is connected to the second contact pattern.

18. The semiconductor memory device of claim 1, wherein the active pattern further comprises:

a first upper horizontal part on the first word line and connected to the first vertical part; and a second upper horizontal part on the second word line and connected to the second vertical part.

19. The semiconductor memory device of claim 18, further comprising:

a first upper dielectric pattern between the first upper horizontal part of the active pattern and a top surface of the first word line; and a second upper dielectric pattern between the second upper horizontal part of the active pattern and a top surface of the second word line.

* * * * *